(12) United States Patent
Arakawa et al.

(10) Patent No.: US 11,043,909 B2
(45) Date of Patent: Jun. 22, 2021

(54) PIEZOELECTRIC DRIVING DEVICE, ELECTRONIC-COMPONENT CONVEYING APPARATUS, AND ROBOT

(71) Applicant: Seiko Epson Corporation, Tokyo (JP)

(72) Inventors: Yutaka Arakawa, Hara-mura (JP); Tomohisa Iwazaki, Shimosuwa (JP)

(73) Assignee: Seiko Epson Corporation

( * ) Notice: Subject to any disclaimer, the term of this patent is extended or adjusted under 35 U.S.C. 154(b) by 304 days.

(21) Appl. No.: 16/188,987

(22) Filed: Nov. 13, 2018

(65) Prior Publication Data
US 2019/0149066 A1 May 16, 2019

(30) Foreign Application Priority Data

Nov. 14, 2017 (JP) .............................. JP2017-219425

(51) Int. Cl.
| | |
|---|---|
| *H02N 2/02* | (2006.01) |
| *H01L 41/09* | (2006.01) |
| *B25J 9/12* | (2006.01) |
| *H02N 2/00* | (2006.01) |
| *H02N 2/10* | (2006.01) |
| *H01L 41/083* | (2006.01) |

(52) U.S. Cl.
CPC ............... *H02N 2/028* (2013.01); *B25J 9/12* (2013.01); *H01L 41/092* (2013.01); *H02N 2/004* (2013.01); *H02N 2/0095* (2013.01); *H02N 2/026* (2013.01); *H02N 2/103* (2013.01); *H01L 41/083* (2013.01)

(58) Field of Classification Search
CPC ...... H02N 2/028; H02N 2/004; H02N 2/0095; H02N 2/026; H02N 2/103

USPC ....................................... 310/323.01–323.21
See application file for complete search history.

(56) References Cited

U.S. PATENT DOCUMENTS

| | | | |
|---|---|---|---|
| 6,252,333 B1* | 6/2001 | Iino | H01L 41/0913 310/323.17 |
| 2014/0307113 A1* | 10/2014 | Ohashi | H02N 2/0095 348/208.11 |

FOREIGN PATENT DOCUMENTS

| | | |
|---|---|---|
| JP | 2008-122381 A | 5/2008 |
| JP | 2013-148395 A | 8/2013 |

* cited by examiner

*Primary Examiner* — Derek J Rosenau
(74) *Attorney, Agent, or Firm* — Harness, Dickey & Pierce, P.L.C.

(57) ABSTRACT

A piezoelectric driving device includes a supporting section, a first moving section movable in a first direction relative to the supporting section, a second moving section movable in a second direction relative to the first moving section, a first driving section configured to drive a first piezoelectric actuator to move the first moving section relative to the supporting section and stop the first piezoelectric actuator to hold the first moving section on the supporting section, and a second driving section configured to drive a second piezoelectric actuator to move the second moving section relative to the first moving section and stop the second piezoelectric actuator to hold the second moving section on the first moving section. A first holding force for holding the first moving section on the supporting section and a second holding force for holding the second moving section on the first moving section are different from each other.

13 Claims, 19 Drawing Sheets

FIG. 3
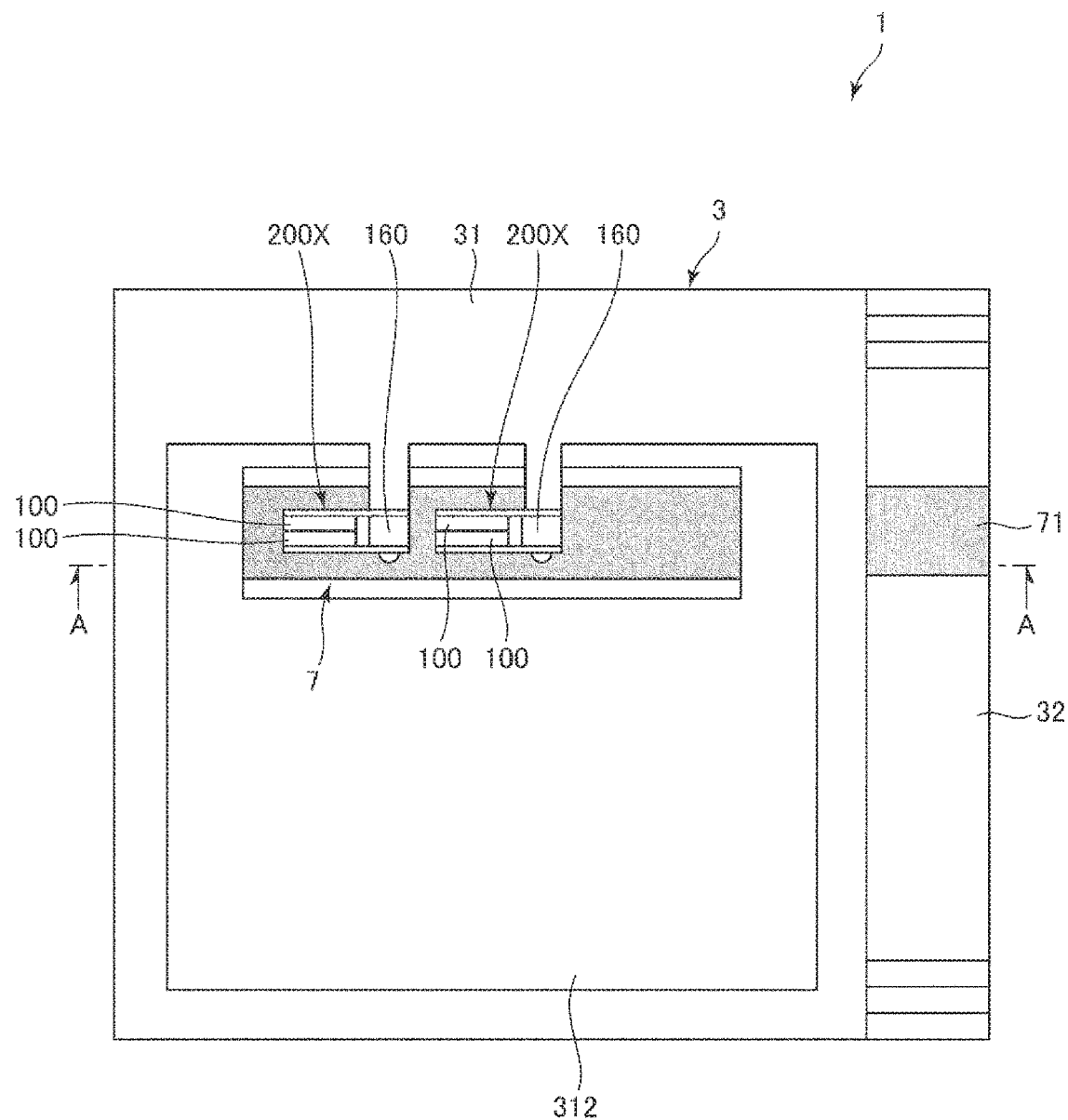
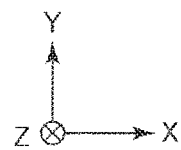

PIEZOELECTRIC DRIVING DEVICE, ELECTRONIC-COMPONENT CONVEYING APPARATUS, AND ROBOT

BACKGROUND

1. Technical Field

The present invention relates to a piezoelectric driving device, an electronic-component conveying apparatus, and a robot.

2. Related Art

For example, JP-A-2008-122381 (Patent Literature 1) describes a stage including a supporting table, a first moving body disposed on the supporting table, a second moving body disposed on the first moving body, a first piezoelectric actuator that moves the first moving body in an X-axis direction relative to the supporting table, and a second piezoelectric actuator that moves the second moving body in a Y-axis direction relative to the first moving body.

In such a stage, the second moving body is disposed on the first moving body. Therefore, a driving force necessary for moving the first moving body in the X-axis direction relative to the supporting table and a holding force necessary for holding the first moving body not to move relative to the supporting table are larger than a driving force necessary for moving the second moving body in the Y-axis direction relative to the first moving body and a holding force necessary for holding the second moving body not to move relative to the first moving body.

However, in Patent Literature 1, although not explained, it is surmised from the drawings and the like that the same piezoelectric actuators are used as the first piezoelectric actuator and the second piezoelectric actuator. Therefore, for example, if the first and second piezoelectric actuators are selected on the basis of the driving force for moving the first moving body relative to the supporting table and the holding force for holding the first moving body relative to the supporting table, a driving force and a holding force of the second piezoelectric actuator become excessive. This is likely to waste driving electric power. Conversely, if the first and second piezoelectric actuators are selected on the basis of the driving force for moving the second moving body relative to the first moving body and the holding force for holding the second moving body relative to the first moving body, a driving force and a holding force of the first piezoelectric actuator become insufficient. This is likely to disable stable driving of the stage.

In this way, the stage described in Patent Literature 1 is likely to make it difficult to achieve both of stable driving of the stage and power saving.

SUMMARY

An advantage of some aspects of the invention is to provide a piezoelectric driving device, an electronic-component conveying apparatus, and a robot that can achieve both of stable driving and power saving.

The advantage can be achieved by the following configuration.

A piezoelectric driving device according to an aspect of the invention includes: a supporting section; a first moving section supported by the supporting section and movable in a first direction relative to the supporting section; a second moving section supported by the first moving section and movable in a second direction crossing the first direction relative to the first moving section; a first driving section including a first piezoelectric actuator and configured to drive the first piezoelectric actuator to move the first moving section in the first direction relative to the supporting section and stop the first piezoelectric actuator to hold the first moving section on the supporting section; and a second driving section including a second piezoelectric actuator and configured to drive the second piezoelectric actuator to move the second moving section in the second direction relative to the first moving section and stop the second piezoelectric actuator to hold the second moving section on the first moving section. A first holding force for holding the first moving section on the supporting section and a second holding force for holding the second moving section on the first moving section are different from each other.

With this configuration, the first holding force and the second holding force can be properly set independently from each other. Therefore, one of the first holding force and the second holding force is prevented from becoming excessive or insufficient. Therefore, the piezoelectric driving device can achieve both of stable driving and power saving.

In the piezoelectric driving device according to the aspect of the invention, it is preferable that a first driving force for moving the first moving section relative to the supporting section and a second driving force for moving the second moving section relative to the first moving section are different from each other.

With this configuration, the first driving force and the second driving force can be properly set independently from each other. Therefore, one of the first driving force and the second driving force is prevented from becoming excessive or insufficient. Therefore, the piezoelectric driving device can achieve both of stable driving and power saving.

In the piezoelectric driving device according to the aspect of the invention, it is preferable that the first piezoelectric actuator and the second piezoelectric actuator have a same configuration, and a number of the first piezoelectric actuators included in the first driving section and a number of the second piezoelectric actuators included in the second driving section are different from each other.

With this configuration, the first and second holding forces and the first and second driving forces can be easily appropriately set simply by setting the number of the piezoelectric actuators as appropriate.

In the piezoelectric driving device according to the aspect of the invention, it is preferable that the first driving section includes a piezoelectric module in which a plurality of the first piezoelectric actuators are stacked, and the second driving section includes a piezoelectric module in which a plurality of the second piezoelectric actuators are stacked.

With this configuration, compared with when a plurality of piezoelectric actuators are separately disposed, space saving for the first driving section and the second driving section can be achieved. Therefore, a reduction in the size and a reduction in the weight of the piezoelectric driving device can be achieved.

In the piezoelectric driving device according to the aspect of the invention, it is preferable that the supporting section is movable in the second direction, and the second holding force is larger than the first holding force.

With this configuration, the second holding force having necessary and sufficient magnitude that can withstand acceleration caused by the movement of the supporting section in the second direction can be secured.

In the piezoelectric driving device according to the aspect of the invention, it is preferable that the piezoelectric driving device further includes: a third moving section supported by the second moving section and turnable around an axis extending along a third direction crossing the first direction and the second direction relative to the second moving section; and a third driving section including a third piezoelectric actuator and configured to drive the third piezoelectric actuator to turn the third moving section relative to the second moving section and stop the third piezoelectric actuator to hold the third moving section on the second moving section.

In this way, the third moving section is added in addition to the first moving section and the second moving section. Consequently, the piezoelectric driving device includes three movable axes. Convenience of the piezoelectric driving device is further improved.

An electronic-component conveying apparatus according to another aspect of the invention includes the piezoelectric driving device according to the aspect of the invention.

With this configuration, the electronic-component conveying apparatus can enjoy the effects of the piezoelectric driving device and achieve both of stable driving and power saving.

A robot according to still another aspect of the invention includes: a first member; a second member supported by the first member and displaceable relative to the first member; a third member supported by the second member and displaceable relative to the second member; a first driving section including a first piezoelectric actuator and configured to drive the first piezoelectric actuator to displace the second member relative to the first member and stop the first piezoelectric actuator to hold the second member on the first member; and a second driving section including a second piezoelectric actuator and configured to drive the second piezoelectric actuator to displace the third member relative to the second member and stop the second piezoelectric actuator to hold the third member on the second member. A first holding force for holding the second member on the first member and a second holding force for holding the third member on the second member are different from each other.

With this configuration, the first holding force and the second holding force can be properly set independently from each other. Therefore, one of the first holding force and the second holding force is prevented from becoming excessive or insufficient. Therefore, the robot can achieve both of stable driving and power saving.

In the robot according to the aspect of the invention, it is preferable that a first driving force for moving the second member relative to the first member and a second driving force for moving the third member relative to the second member are different from each other.

With this configuration, the first driving force and the second driving force can be properly set independently from each other. Therefore, one of the first driving force and the second driving force can be prevented from becoming excessive or insufficient. Therefore, the robot can achieve both of stable driving and power saving.

In the robot according to the aspect of the invention, it is preferable that the first piezoelectric actuator and the second piezoelectric actuator have a same configuration, and a number of the first piezoelectric actuators included in the first driving section and a number of the second piezoelectric actuators included in the second driving section are different from each other.

With this configuration, the first and second holding forces and the first and second driving forces can be easily appropriately set simply by setting the number of the piezoelectric actuators as appropriate.

BRIEF DESCRIPTION OF THE DRAWINGS

The invention will be described with reference to the accompanying drawings, wherein like numbers reference like elements.

FIG. 3 is a plan view showing an X moving section included in the electronic-component holding device shown in FIG. 2.

DESCRIPTION OF EXEMPLARY EMBODIMENTS

Preferred embodiments of the invention are explained in detail below with reference to the accompanying drawings.

First Embodiment

First, an electronic-component conveying apparatus according to a first embodiment of the invention is explained.

Figure 1:
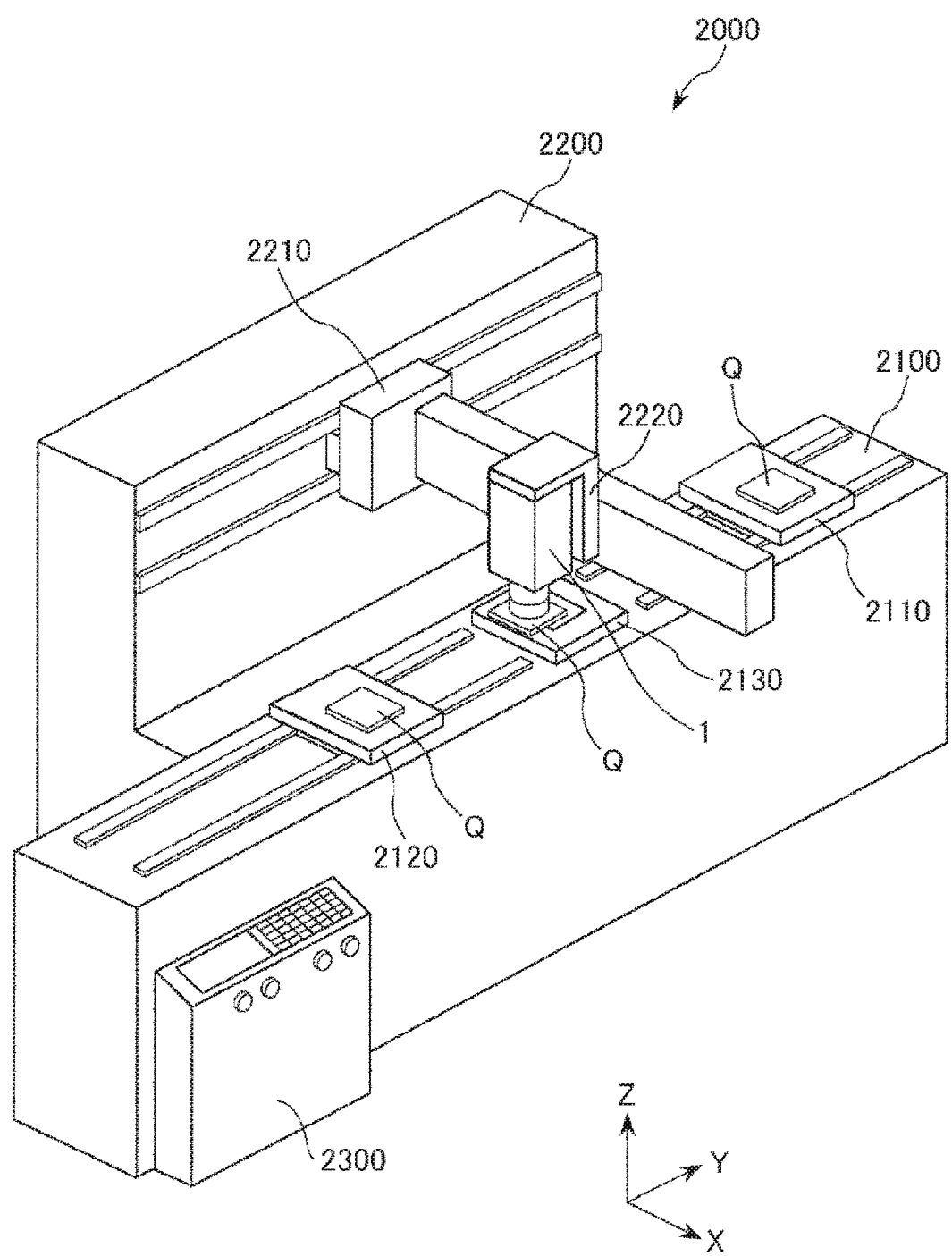
FIG. 1 is a perspective view showing an electronic-component conveying apparatus according to a first embodiment of the invention.
Figure 2:
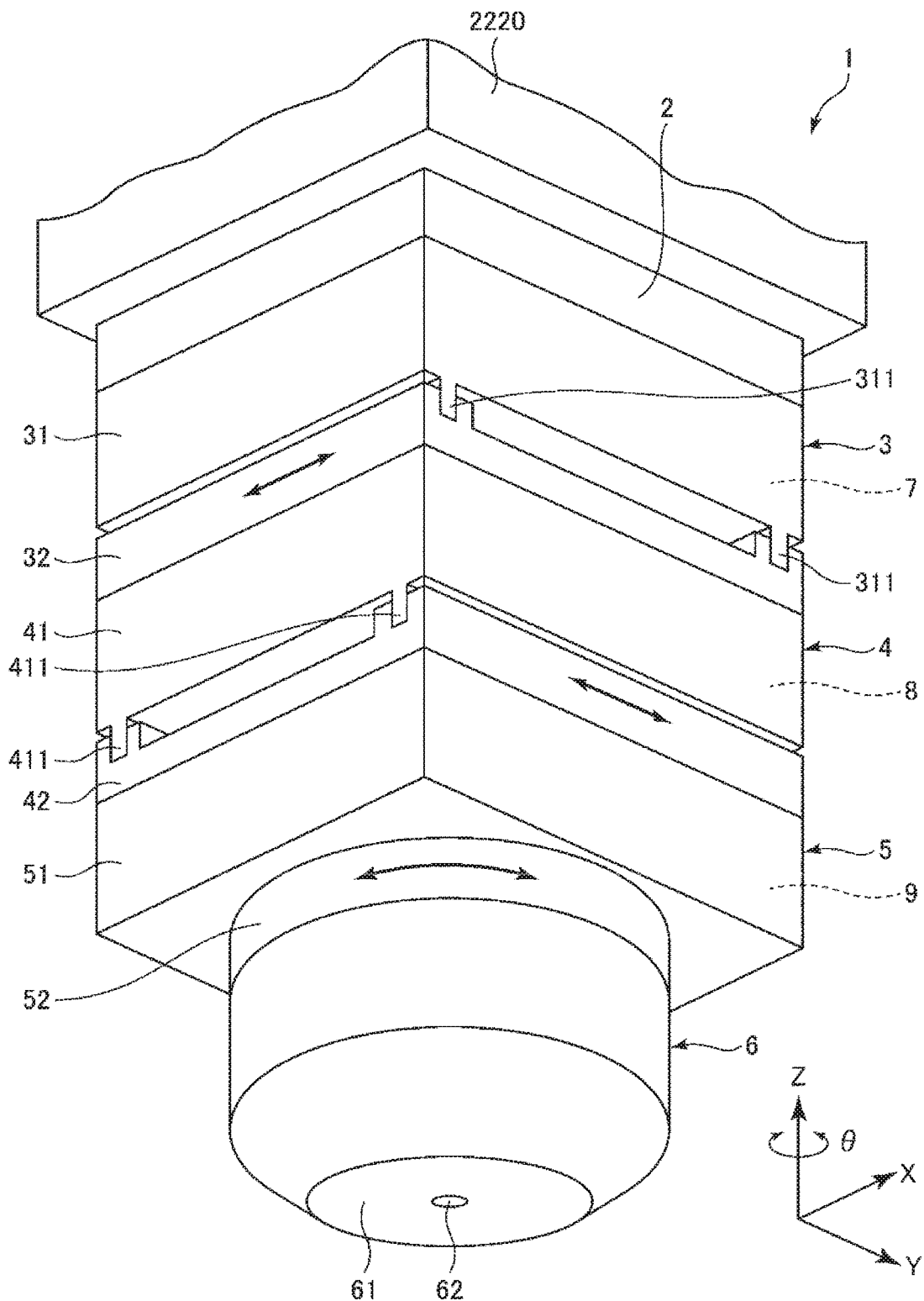
FIG. 2 is a perspective view showing an electronic-component holding device included in the electronic-component conveying apparatus shown in FIG. 1.
Figure 4:
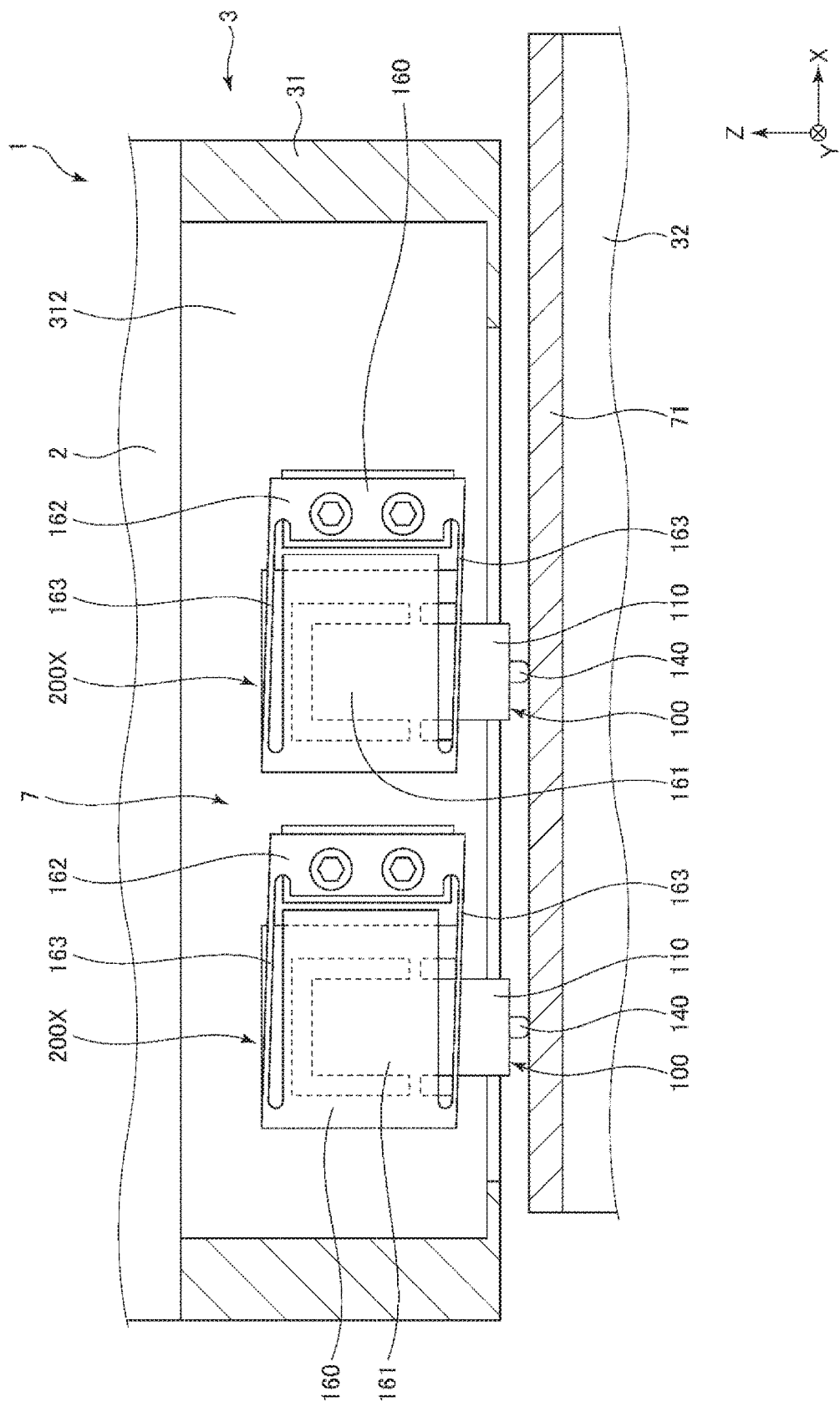
FIG. 4 is an A-A line sectional view in FIG. 3.
Figure 5:
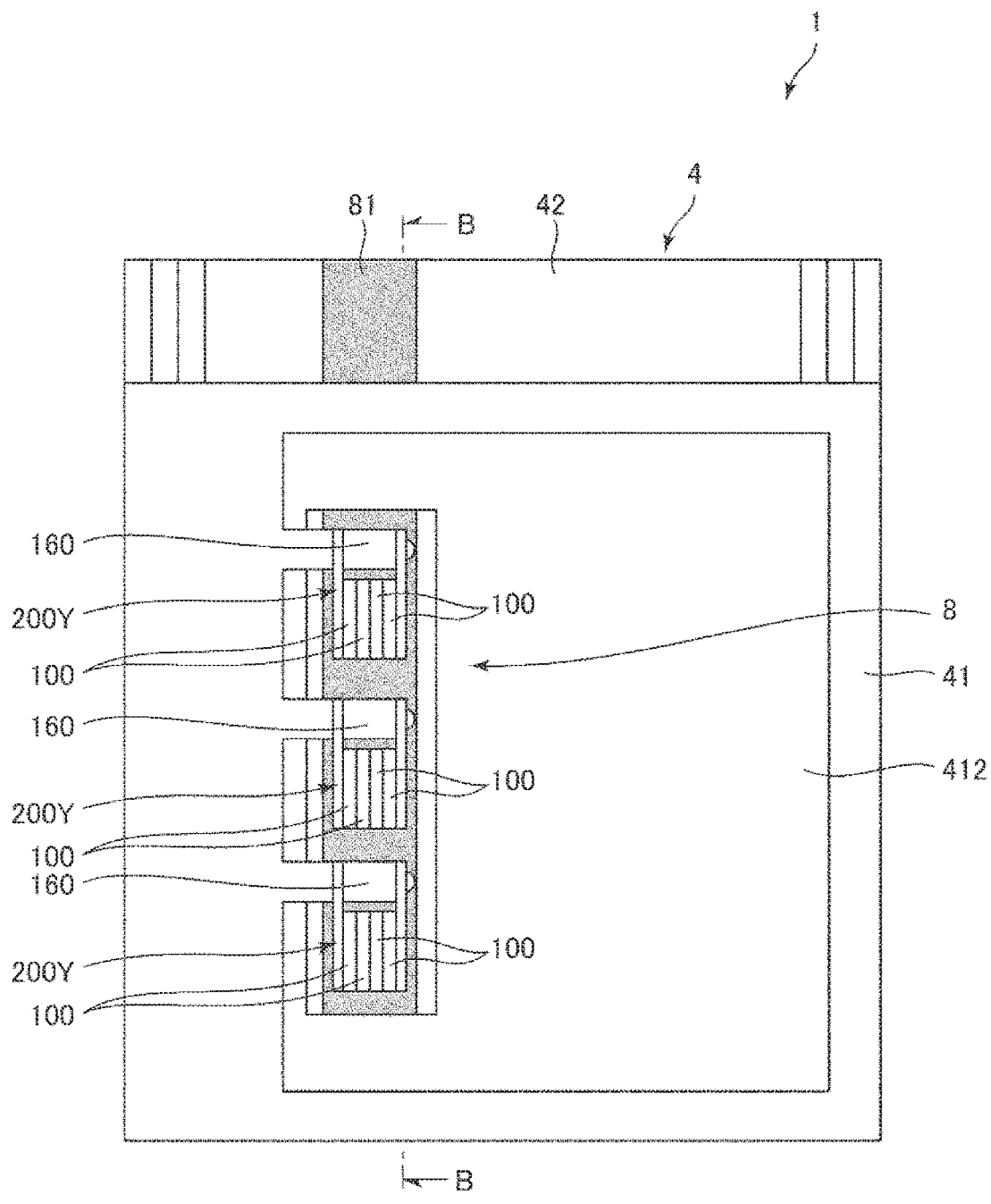
FIG. 5 is a plan view showing a Y moving section included in the electronic-component holding device shown in FIG. 2.
Figure 6:
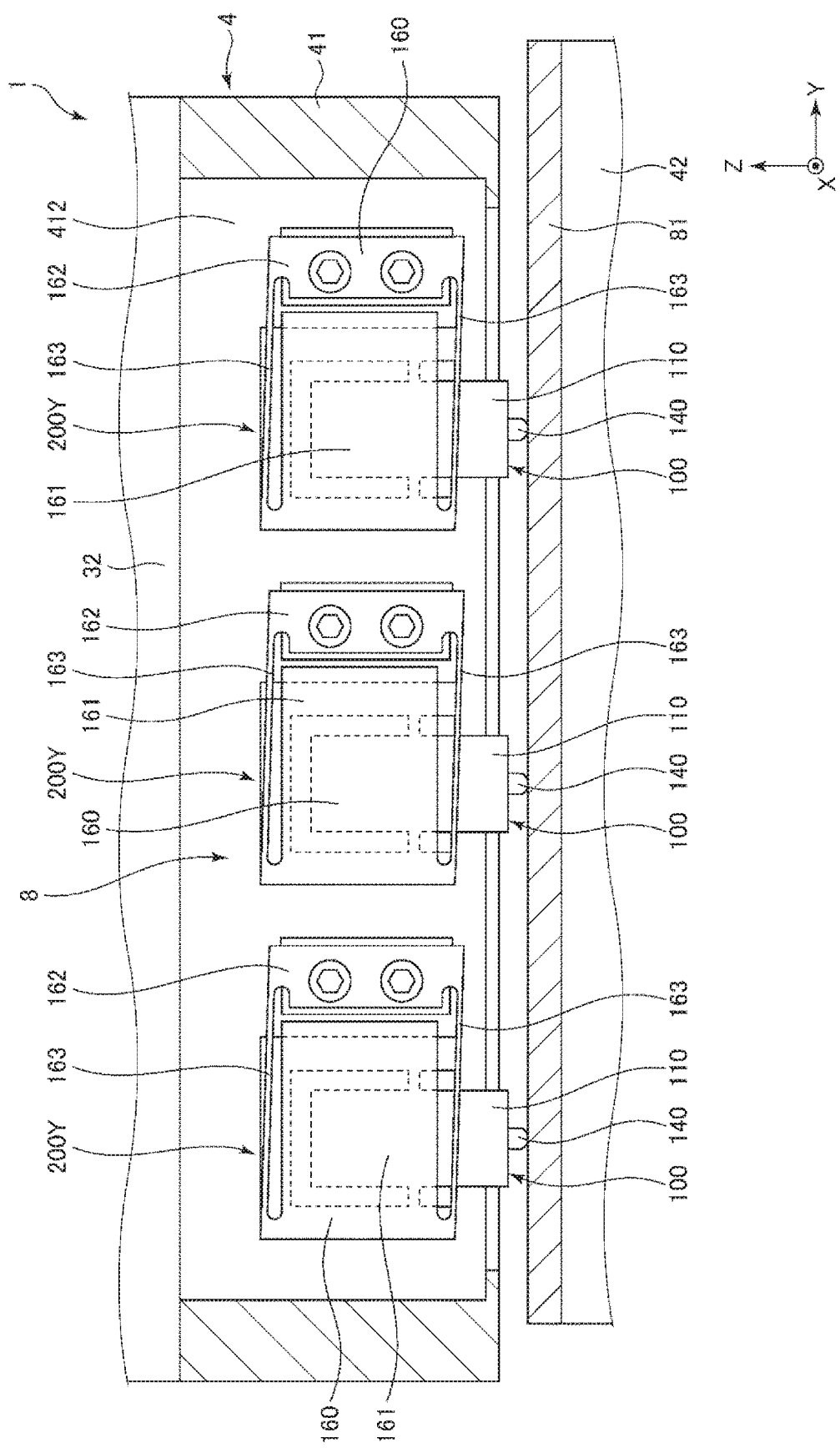
FIG. 6 is a B-B line sectional view in FIG. 5.
Figure 7:
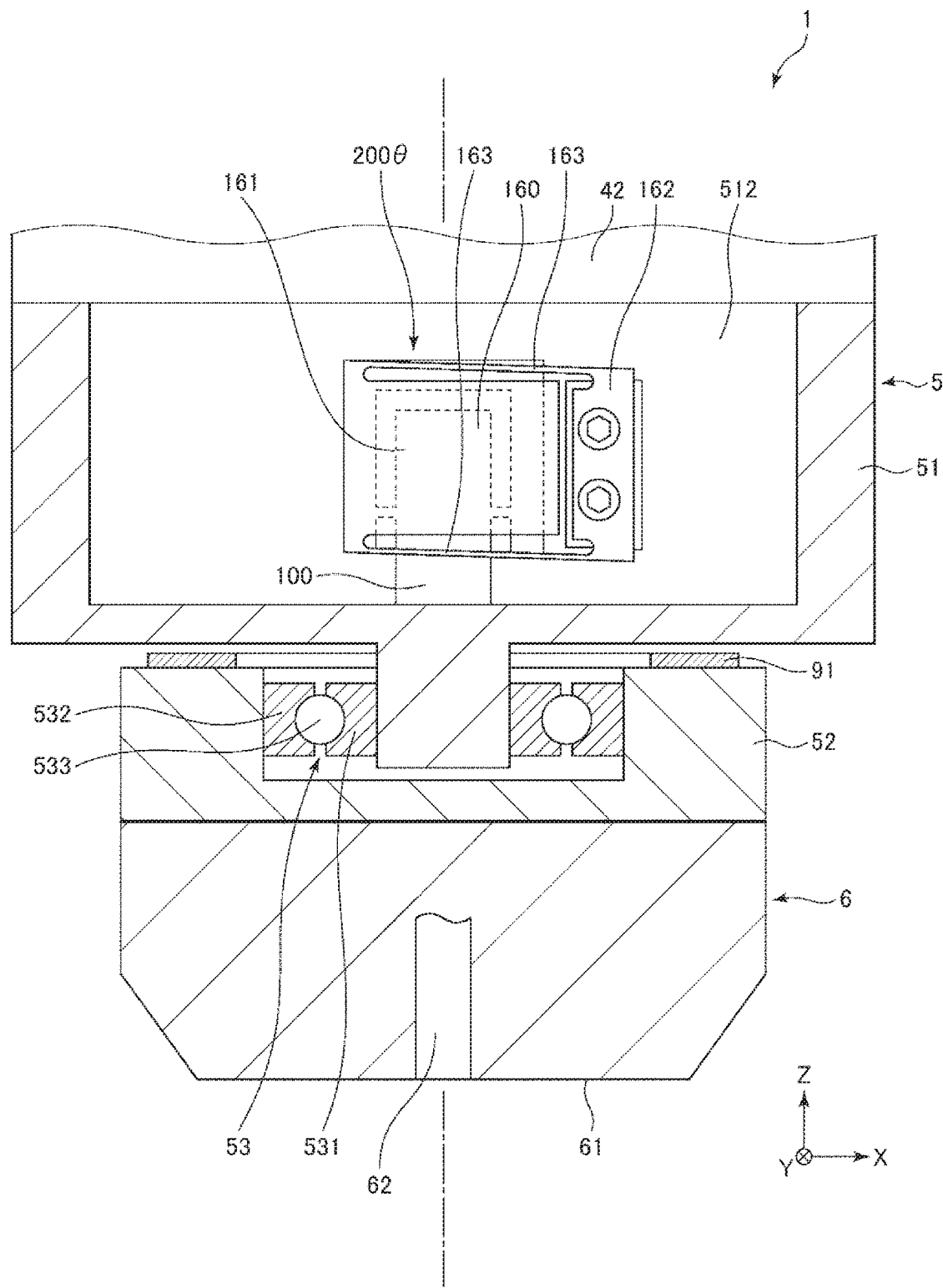
FIG. 7 is a sectional view showing a θ moving section and a holding section included in the electronic-component holding device shown in FIG. 2.
Figure 8:
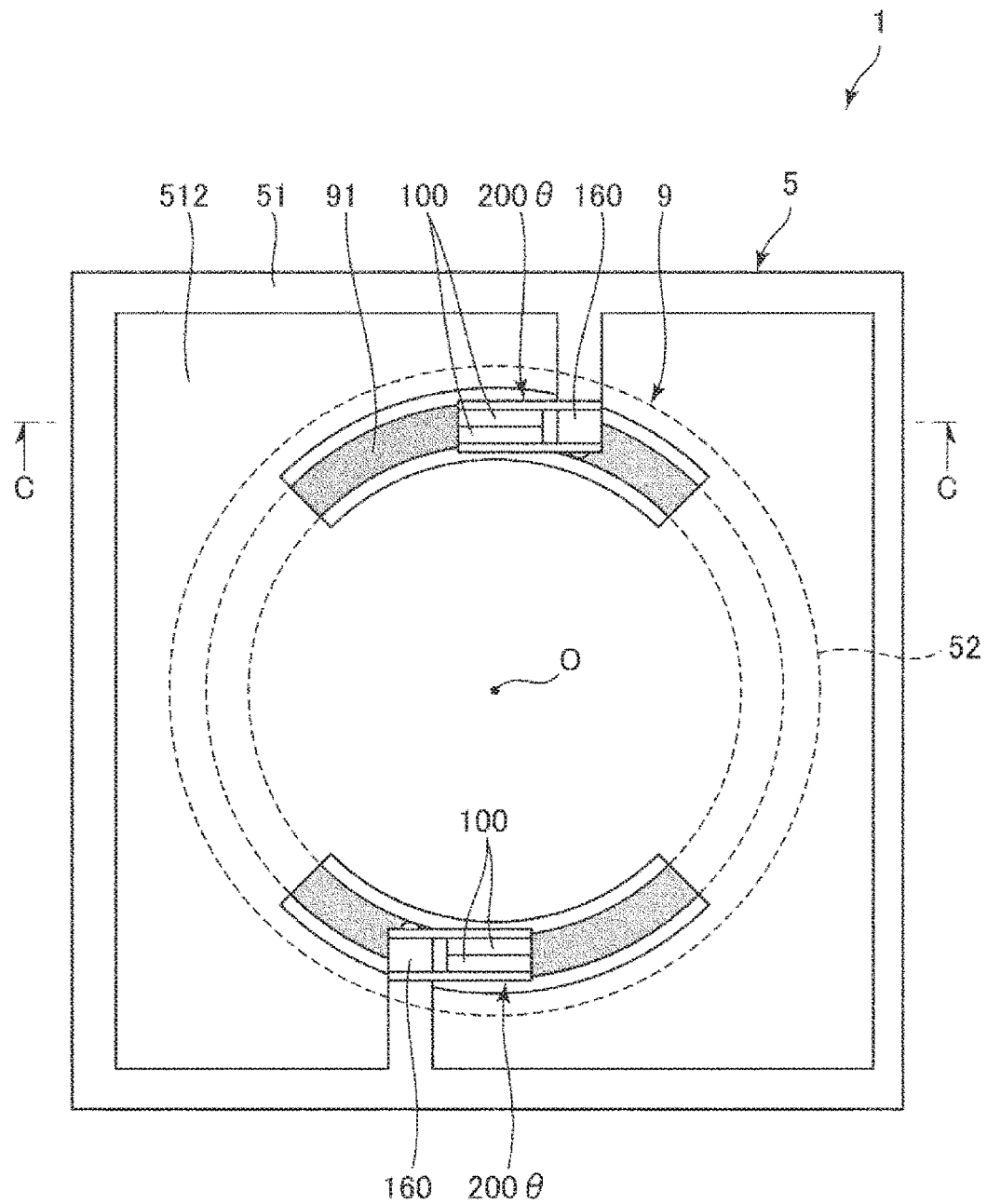
FIG. 8 is a plan view showing the θ moving section included in the electronic-component holding device shown in FIG. 2.
Figure 9:
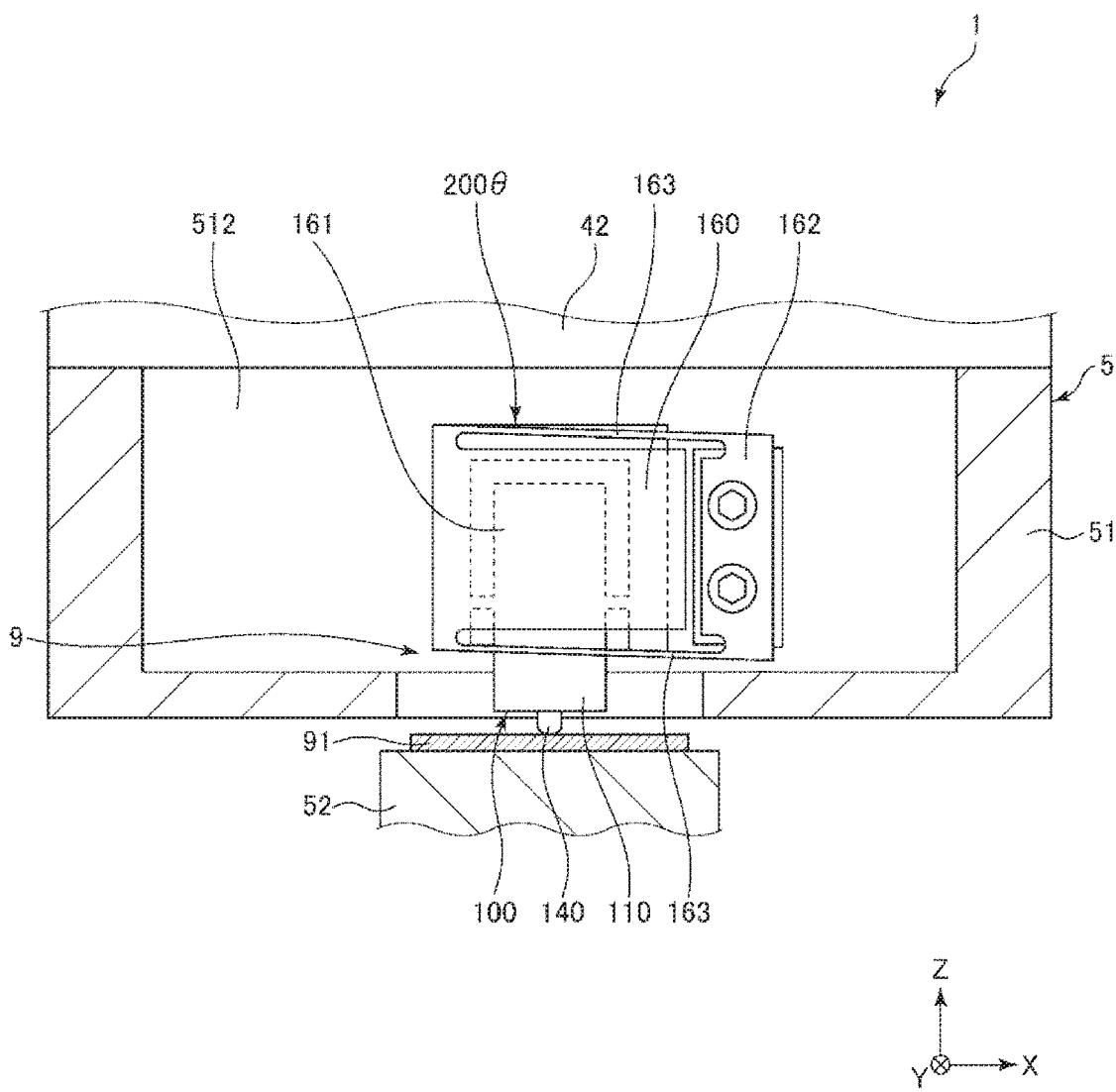
FIG. 9 is a C-C line sectional view in FIG. 8.
Figure 10:
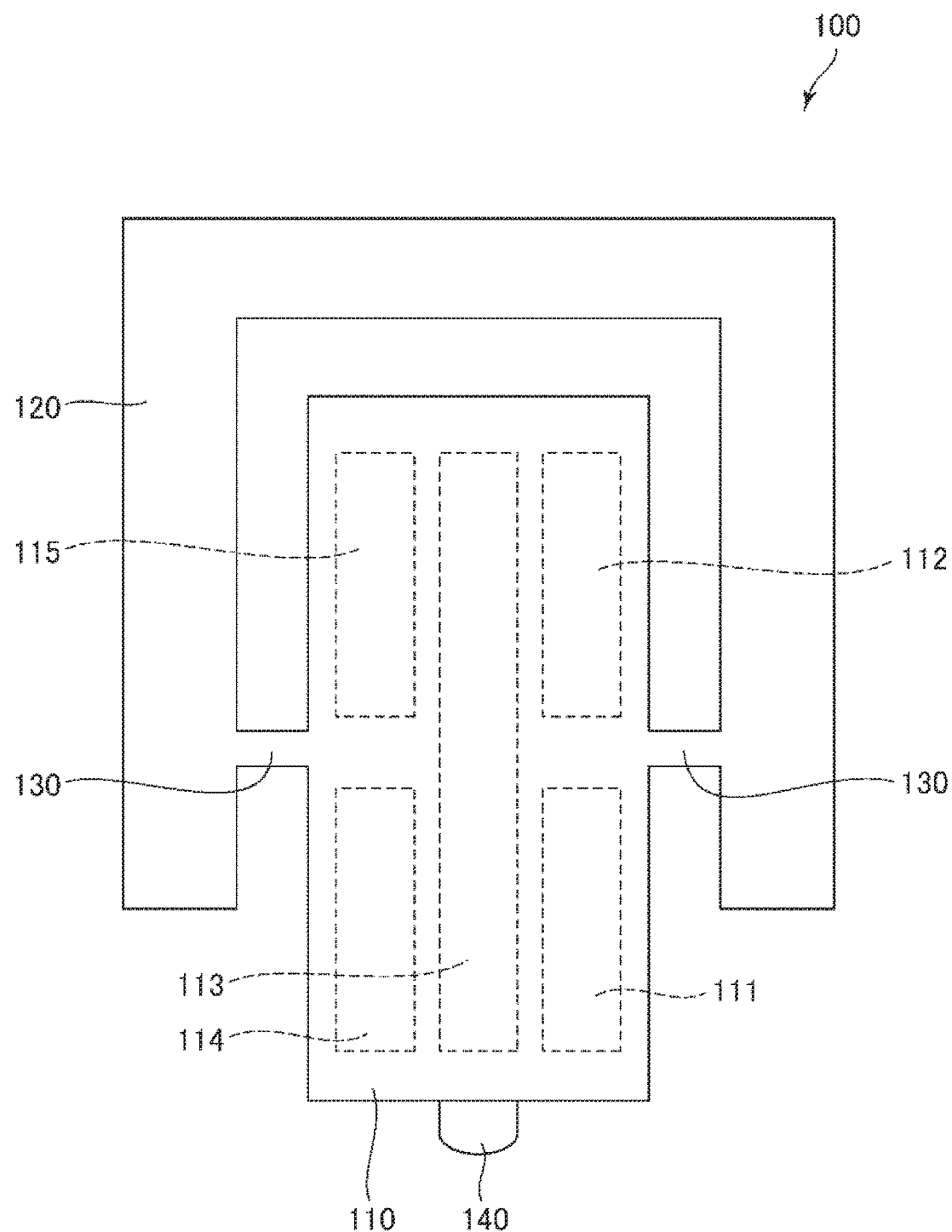
FIG. 10 is a plan view showing a piezoelectric actuator.
Figure 11:
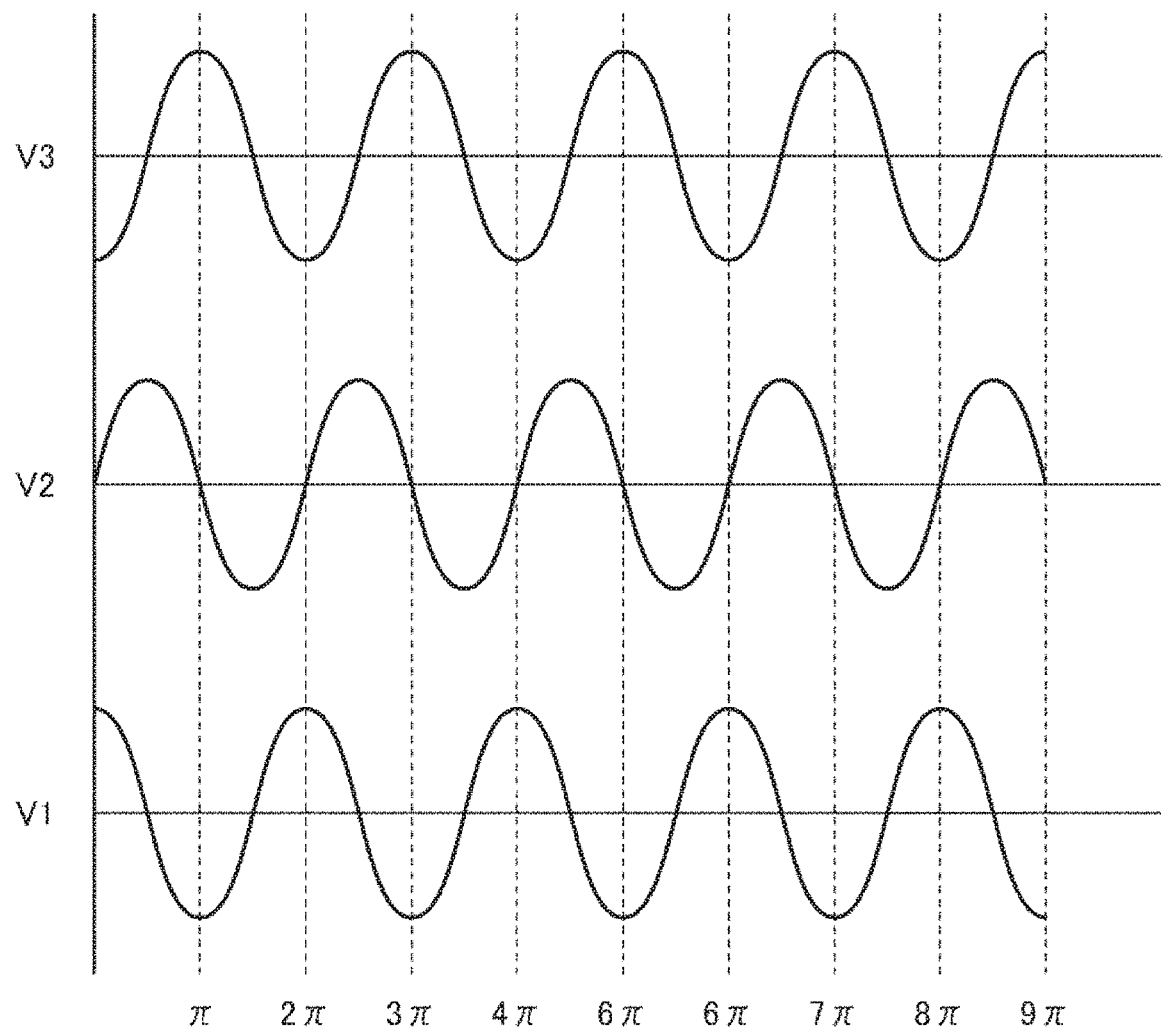
FIG. 11 is a diagram showing a voltage applied to the piezoelectric actuator.
Figure 12:
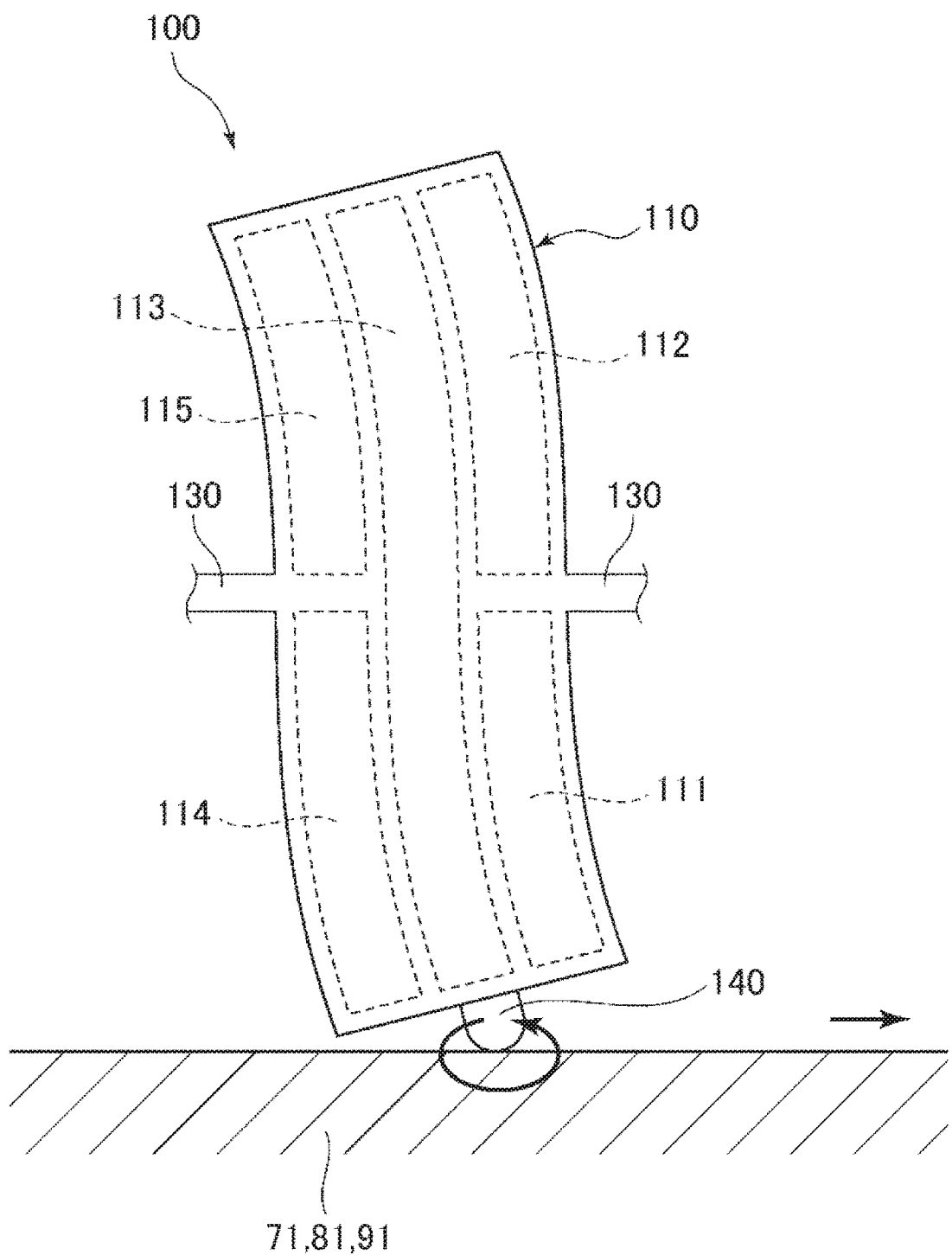
FIG. 12 is a diagram showing driving of the piezoelectric actuator at the time when the voltage shown in FIG. 11 is applied to the piezoelectric actuator.
Figure 13:
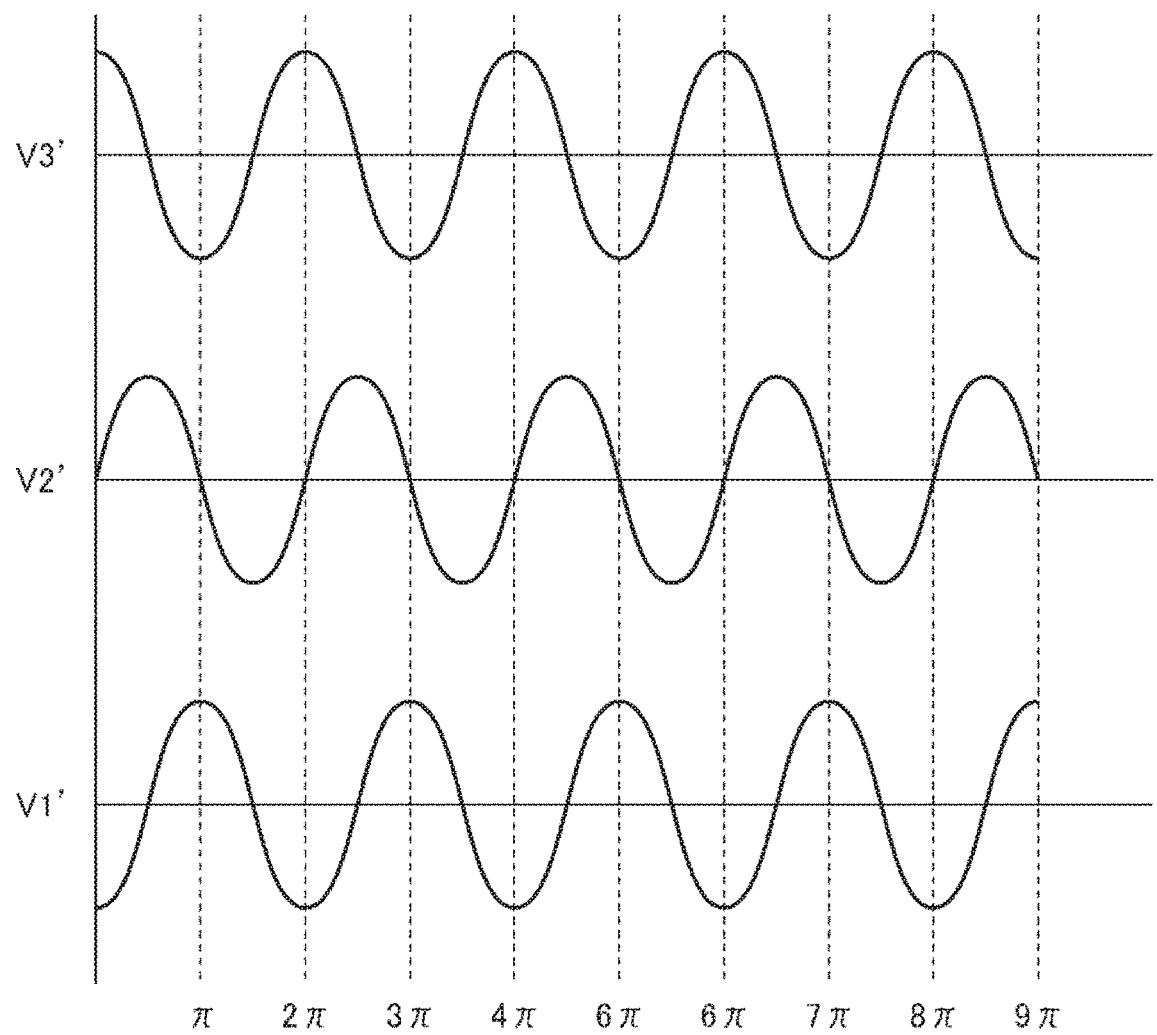
FIG. 13 is a diagram showing a voltage applied to the piezoelectric actuator.
Figure 14:
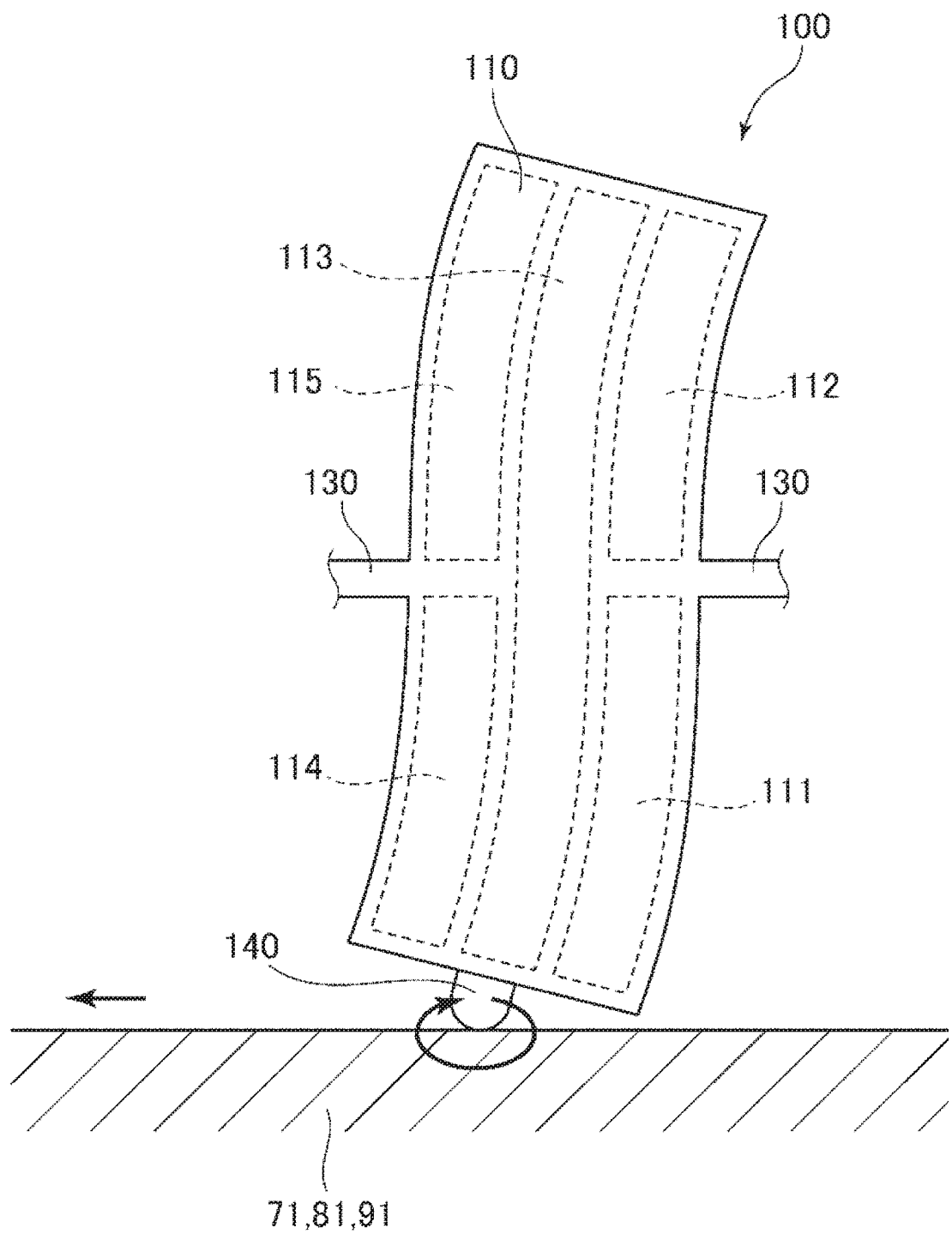
FIG. 14 is a diagram showing driving of the piezoelectric actuator at the time when the voltage shown in FIG. 13 is applied to the piezoelectric actuator.
Figure 15:
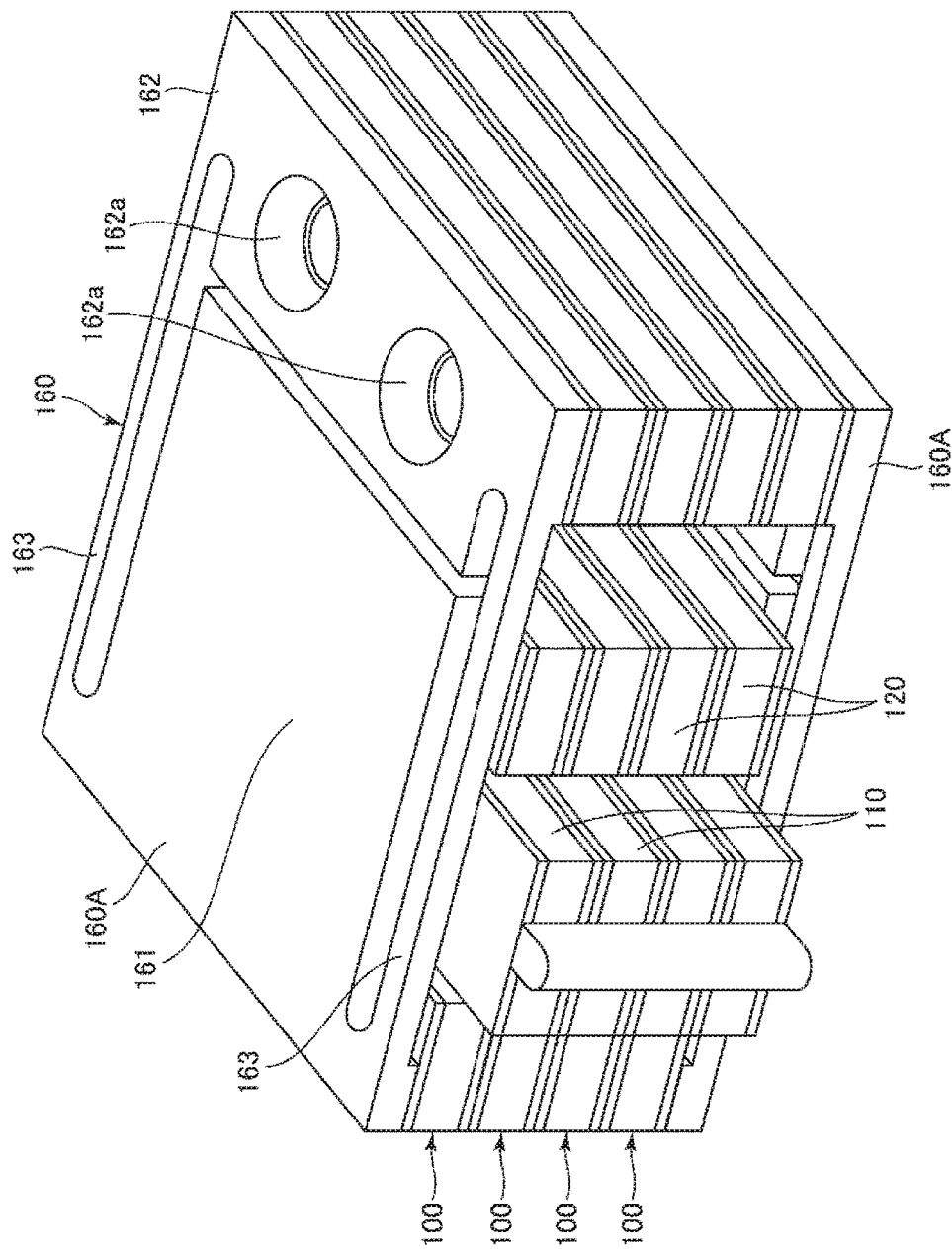
FIG. 15 is a perspective view showing an urging section included in a piezoelectric module.

FIG. 1 is a perspective view showing the electronic-component conveying apparatus according to the first embodiment. FIG. 2 is a perspective view showing an electronic-component holding device included in the electronic-component conveying apparatus shown in FIG. 1. FIG. 3 is a plan view showing an X moving section included in the electronic-component holding device shown in FIG. 2. FIG. 4 is an A-A line sectional view in FIG. 3. FIG. 5 is a plan view showing a Y moving section included in the electronic-component holding device shown in FIG. 2. FIG. 6 is a B-B line sectional view in FIG. 5. FIG. 7 is a sectional view showing a θ moving section and a holding section included in the electronic-component holding device shown in FIG. 2. FIG. 8 is a plan view showing the θ moving section included in the electronic-component holding device shown in FIG. 2. FIG. 9 is a C-C line sectional view in FIG. 8. FIG. 10 is a plan view showing a piezoelectric actuator. FIG. 11 is a diagram showing a voltage applied to the piezoelectric actuator. FIG. 12 is a diagram showing driving of the piezoelectric actuator at the time when the voltage shown in FIG. 11 is applied to the piezoelectric actuator. FIG. 13 is a diagram showing a voltage applied to the piezoelectric actuator. FIG. 14 is a diagram showing driving of the piezoelectric actuator at the time when the voltage shown in FIG. 13 is applied to the piezoelectric actuator. FIG. 15 is a perspective view showing an urging section included in a piezoelectric module.

Note that, in the following explanation, for convenience of explanation, three axes orthogonal to one another are represented as an X axis, a Y axis, and a Z axis. A direction parallel to the X axis is referred to as "X-axis direction". A direction parallel to the Y axis is referred to as "Y-axis direction". A direction parallel to the Z axis is referred to as "Z-axis direction". In this embodiment, a Z-axis direction minus side (the opposite side of the direction of an arrow) is a vertical-direction lower side.

An electronic-component conveying apparatus 2000 shown in FIG. 1 is applied to an electronic-component inspection apparatus. Such an electronic-component conveying apparatus 2000 includes a base 2100, a supporting table 2200 disposed on a side of the base 2100, and a control device 2300 configured to control driving of sections. On the base 2100, an upstream side stage 2110 on which an inspection target electronic component Q is placed and conveyed in the Y-axis direction, a downstream side stage 2120 on which an inspected electronic component Q is placed and conveyed in the Y-axis direction, and an inspection table 2130 located between the upstream side stage 2110 and the downstream side stage 2120 and used to inspect electric characteristics of the electronic component Q are provided. The inspection target electronic component Q is not particularly limited. Examples of the inspection target electronic component Q include a semiconductor, a semiconductor wafer, display devices such as a CLD and an OLED, a quartz device, various sensors, an inkjet head, and various MEMS devices.

On the supporting table 2200, a Y stage 2210 movable in the Y-axis direction relative to the supporting table 2200 is provided. On the Y stage 2210, an Z stage 2220 movable in the Z-axis direction relative to the Y stage 2210 is provided. On the Z stage 2220, an electronic-component holding device 1 functioning as a piezoelectric driving device is provided.

The control device 2300 is configured by a computer and includes, for example, a processor (a CPU), a memory, and an I/F (an interface). The processor executes a predetermined computer program (code string) stored in the memory to control driving of the sections (in particular, the electronic-component holding device 1) of the electronic-component conveying apparatus 2000. Note that the computer program may be downloaded from an external server via the I/F. All or a part of components of the control device 2300 may be provided on the outside of the electronic-component conveying apparatus 2000 and connected via a communication network such as a LAN (a local area network).

As shown in FIG. 2, the electronic-component holding device 1 includes a supporting section 2 fixed to the Z stage 2220, an X moving section 3 located on the vertical-direction lower side of the supporting section 2 and movable in the X-axis direction relative to the supporting section 2, a Y moving section 4 located on the vertical-direction lower side of the X moving section 3 and movable in the Y-axis direction relative to the X moving section 3, a θ moving section 5 located on the vertical-direction lower side of the Y moving section 4 and movable around the Z axis (in a θ direction) relative to the Y moving section 4, and a holding section 6 provided in the θ moving section 5 and configured to hold the electronic component Q.

The electronic-component holding device 1 includes an X driving section 7 configured to move the X moving section 3 relative to the supporting section 2 and hold the X moving section 3 not to move relative to the supporting section 2, a Y driving section 8 configured to move the Y moving section 4 relative to the X moving section 3 and hold the Y moving section 4 not to move relative to the X moving section 3, and a θ driving section 9 configured to move the θ moving section 5 relative to the Y moving section 4 and hold the θ moving section 5 not to move relative to the Y moving section 4. With such an electronic-component holding device 1, the position and the direction of the electronic component Q held by the holding section 6 can be finely adjusted by moving the X moving section 3 relative to the supporting section 2, moving the Y moving section 4 relative to the X moving section 3, and moving the θ moving section 5 relative to the Y moving section 4. Therefore, the electronic component Q held by the holding section 6 can be accurately supplied to the inspection table 2130.

As shown in FIG. 2, the X moving section 3 includes a base 31 located on the lower side of the supporting section and fixed to the supporting section 2 and a stage 32 movable in the X-axis direction relative to the base 31. A pair of rails 311 extending in the X-axis direction is provided on the lower surface of the base 31. The stage 32 moves along the pair of rails 311. As shown in FIG. 3, a housing space 312 is formed in the base 31. Piezoelectric modules 200X included in the X driving section 7 are disposed in the housing space 312.

The X driving section 7 includes a driven member fixed on the upper surface of the stage 32 and two piezoelectric modules 200X fixed to the base 31. The driven member 71 is formed in a long tabular shape and disposed along the X-axis direction on the upper surface of the stage 32. On the other hand, the piezoelectric modules 200X are fixed to the base 31 in a state in which the piezoelectric modules 200X are housed in the housing space 312 of the base 31. As shown in FIG. 4, in a state in which the piezoelectric modules 200X are fixed to the base 31, the piezoelectric modules 200X are urged toward the driven member 71 and in contact with the upper surface of the driven member 71 with an appropriate frictional force. When the piezoelectric modules 200X are stopped, the stage 32 is held on the base 31 by the frictional force. The movement of the stage 32 relative to the base 31 is prevented. Conversely, when the piezoelectric modules 200X are driven, driving forces of the piezoelectric modules 200X are transmitted to the driven member 71. The stage 32 moves relative to the base 31.

As shown in FIG. 2, the Y moving section 4 includes a base 41 located on the lower side of the stage 32 and fixed to the stage 32 and a stage 42 movable in the Y-axis direction relative to the base 41. A pair of rails 411 extending in the Y-axis direction is provided on the lower surface of the base 41. The stage 42 moves along the pair of rails 411. As shown in FIG. 5, a housing space 412 is formed in the base 41. Piezoelectric modules 200Y included in the Y driving section 8 are disposed in the housing space 412.

The Y driving section 8 includes a driven member fixed to the upper surface of the stage 42 and three piezoelectric modules 200Y fixed to the base 41. The driven member 81 is formed in a long tabular shape and disposed along the Y-axis direction on the upper surface of the stage 42. On the other hand, the piezoelectric modules 200Y are fixed to the base 41 in a state in which the piezoelectric modules 200Y are housed in the housing space 412 of the base 41. As shown in FIG. 6, in a state in which the piezoelectric modules 200Y are fixed to the base 41, the piezoelectric modules 200Y are urged toward the driven member 81 and in contact with the upper surface of the driven member 81 with an appropriate frictional force. When the piezoelectric modules 200Y are stopped, the stage 42 is held on the base 41 by the frictional force. The movement of the stage 42 relative to the base 41 is prevented. Conversely, when the piezoelectric modules 200Y are driven, driving forces of the piezoelectric modules 200Y are transmitted to the driven member 81. The stage 42 moves relative to the base 41.

As shown in FIG. 2, the θ moving section 5 includes a base 51 located on the lower side of the stage 42 and fixed to the stage 42 and a stage 52 movable in the θ direction relative to the base 51. As shown in FIG. 7, the base 51 and the stage 52 are connected via a bearing 53 having the Z axis as a rotation axis. The stage 52 rotates around a center axis O of the bearing 53. The bearing 53 is formed by, for example, a ball bearing. The bearing 53 includes an inner ring 531 fixed to the base 51, an outer ring 532 fixed to the stage 52, and a plurality of balls 533 provided between the inner ring 531 and the outer ring 532. As shown in FIG. 8, a housing space 512 is formed in the base 51. Piezoelectric modules 200θ included in the θ driving section 9 are disposed in the housing space 512.

The θ driving section 9 includes a driven member fixed to the upper surface of the stage 52 and two piezoelectric modules 200θ fixed to the base 51. The driven member 91 is formed in an annular shape and disposed on the upper surface of the stage 52 concentrically with the center axis O of the bearing 53. On the other hand, the piezoelectric modules 200θ are fixed to the base 51 in a state in which the piezoelectric modules 200θ are housed in the housing space 512 of the base 51. As shown in FIG. 9, in a state in which the piezoelectric modules 200θ are fixed to the base 51, the piezoelectric modules 200θ are urged toward the driven member 91 and in contact with the upper surface of the driven member 91 with an appropriate frictional force. When the piezoelectric modules 200θ are stopped, the stage 52 is held on the base 51 by the frictional force. The movement of the stage 52 relative to the base 51 is prevented. Conversely, when the piezoelectric modules 200θ are driven, driving forces of the piezoelectric modules 200θ are transmitted to the driven member 91. The stage 52 turns around the center axis O relative to the base 51.

As shown in FIG. 2, the holding section 6 is located on the lower side of the stage 52 and fixed to the stage 52. In the holding section 6, a suction hole 62 opened on a suction surface 61, which is the lower surface of the holding section 6, is provided. The electric component Q can be sucked to and held on the suction surface 61 of the holding section 6 by decompressing the inside of the suction hole 62. However, a method for holding the electronic component Q is not limited to the suction.

The configuration of the electronic-component holding device 1 is briefly explained above. The X driving section 7, the Y driving section 8, and the θ driving section 9 are explained in detail below. As explained above, the X driving section 7 includes the driven member 71 and the two piezoelectric modules 200X configured to transmit driving forces to the driven member 71. The Y driving section 8 includes the driven member 81 and the three piezoelectric modules 200Y configured to transmit driving forces to the driven member 81. The θ driving section 9 includes the driven member 91 and the two piezoelectric modules 200θ configured to transmit driving forces to the driven member 91.

The driven members 71, 81, and 91 are configured by the same material. Coefficients of friction of the surfaces (surfaces in contact with piezoelectric actuators 100) of the driven members 71, 81, and 91 are substantially equal to one another. Note that the constituent material of the driven members 71, 81, and 91 is not particularly limited. However, it is desirable to use a material having relatively high abrasion resistance such as a ceramics material. Consequently, sufficiently high coefficients of friction can be obtained. The driven members 71, 81, and are excellent in durability. The coefficients of friction of the driven members 71, 81, and 91 can be maintained sufficiently high over time. However, the driven members 71, 81, and 91 may be configured by materials different from one another. The coefficients of friction of the driven members 71, 82, and 91 may be different from one another.

The piezoelectric modules 200X, 200Y, and 200θ respectively include the piezoelectric actuators 100 having the same configuration. The piezoelectric actuator 100 includes, as shown in FIG. 10, a vibrating section 110, a supporting section 120 configured to support the vibrating section 110, a pair of connecting sections 130 configured to connect the vibrating section 110 and the supporting section 120, and a transmitting section 140 provided at the distal end portion of the vibrating section 110 and configured to transmit a driving force of the vibrating section 110 to the driven members 71, 81, and 91.

Five piezoelectric elements 111, 112, 113, 114, and 115 are provided in the vibrating section 110. The piezoelectric element 113 is disposed along the longitudinal direction of the vibrating section 110 in the center in the width direction of the vibrating section 110. The piezoelectric elements 111 and 112 are disposed along the longitudinal direction of the vibrating section 110 on one side in the width direction of the vibrating section 110 with respect to the piezoelectric element 113. The piezoelectric elements 114 and 115 are disposed along the longitudinal direction of the vibrating section 110 on the other side. The piezoelectric elements 111, 112, 113, 114, and 115 expand and contract in the longitudinal direction of the vibrating section 110 according to application of a voltage.

In such a piezoelectric actuator 100, for example, when a voltage V1 shown in FIG. 11 is applied to the piezoelectric elements 111 and 115, a voltage V2 shown in FIG. 11 is applied to the piezoelectric element 113, and a voltage V3 shown in FIG. 11 is applied to the piezoelectric elements 112 and 114, the vibrating section 110 expands and contracts in the longitudinal direction and bends in the width direction to flexurally vibrate in an S shape. According to the flexural vibration, the transmitting section 140 performs an elliptical motion counterclockwise in FIG. 12 as shown in FIG. 12. Conversely, when a voltage V1' shown in FIG. 13 is applied to the piezoelectric elements 111 and 115, a voltage V2' shown in FIG. 13 is applied to the piezoelectric element 113, and a voltage V3' shown in FIG. 13 is applied to the piezoelectric elements 112 and 114, the vibrating section 110 expands and contracts in the longitudinal direction and bends in the width direction to flexurally vibrate in an S shape. According to the flexural vibration, the transmitting section 140 performs an elliptical motion clockwise in FIG. 14 as shown in FIG. 14. Such an elliptical motion of the transmitting section 140 is transmitted to the driven members 71, 81, and 91, whereby the stage 32 moves in the X-axis direction relative to the base 31, the stage 42 moves in the Y-axis direction relative to the base 41, and the stage 52 moves in the θ direction relative to the base 51.

An urging section 160 is attached to such piezoelectric actuators 100. The piezoelectric actuators 100 are fixed to the bases 31, 41, and 51 via the urging section 160. The urging section 160 has a function of urging the piezoelectric actuators 100 toward the driven members 71, 81, and 91. As shown in FIG. 15, the urging section 160 includes a pair of substrates 160A configured to hold the piezoelectric actuators 100. The pair of substrates 160A respectively includes bases 161, fixing sections 162, and spring sections 163 configured to connect the bases 161 and the fixing sections 162. The piezoelectric actuators 100 are fixed to the bases 161 via an adhesive or the like. The fixing sections 162 are portions fixed to the bases 31, 41, and 51. In each of the fixing sections 162, two through-holes 162a for fixing the fixing sections 162 to the base 31 are provided. Note that, in FIG. 15, for convenience of explanation, a configuration is illustrated in which the urging section 160 holds a stacked body of four piezoelectric actuators 100.

As shown in FIG. 3, in the X driving section 7, each of the two piezoelectric modules 200X includes stacked two piezoelectric actuators 100. That is, the X driving section 7 includes four piezoelectric actuators 100 in total. Note that the four piezoelectric actuators 100 are respectively controlled to be driven in the same manner. That is, the voltage shown in FIG. 11 or FIG. 13 is simultaneously applied to the four piezoelectric actuators 100.

As shown in FIG. 4, the two piezoelectric modules 200X are disposed side by side in the X-axis direction and fixed (screwed) to the base 31 in the fixing sections 162. In a state in which the piezoelectric modules 200X are fixed to the base 31, the piezoelectric modules 200X are urged toward the driven member 71 using the elasticity of the spring sections 163. The distal end portions of the transmitting sections 140 are pressed against the upper surface of the driven member 71. Therefore, when the piezoelectric modules 200X are stopped, a sufficient frictional force acts between the transmitting sections 140 and the driven member 71, the stage 32 is held on the base 31, and the movement of the stage 32 relative to the base 31 is restricted. On the other hand, the stage 32 can be moved in the X-axis direction relative to the base 31 by driving the piezoelectric modules 200X to cause the transmitting sections 140 to perform an elliptical motion.

A holding force Fxs for holding the stage 32 on the base 31 and a driving force Fxd for moving the stage 32 in the X-axis direction relative to the base 31 are respectively proportional to the number of the piezoelectric actuators 100 included in the X driving section 7. That is, as the number of the piezoelectric actuators 100 is larger, the holding force Fxs and the driving force Fxd respectively increase. As the number of the piezoelectric actuators 100 is smaller, the holding force Fxs and the driving force Fxd respectively decrease. As explained above, the Y moving section 4, the θ moving section 5, and the holding section 6 are suspended from the stage 32. The weight of the Y moving section 4, the θ moving section 5, and the holding section 6 is applied to the stage 32. Therefore, a relatively large holding force Fxs and a relatively large driving force Fxd are necessary. Therefore, in this embodiment, the four piezoelectric actuators 100 are disposed in the X driving section 7 to secure the holding force Fxs and the driving force Fxd having necessary and sufficient magnitudes.

As explained above, in this embodiment, the X driving section 7 includes the two piezoelectric modules 200X in each of which the two piezoelectric actuators 100 are stacked. However, for example, with a configuration including one piezoelectric module 200X in which four piezoelectric actuators 100 are stacked or a configuration including four piezoelectric modules 200X each including one piezoelectric actuator 100, the holding force Fxs and the driving force Fxd having substantially the same magnitudes can be exerted because the number of the piezoelectric actuators 100 is the same.

Note that the number of the piezoelectric modules 200X and the number of the piezoelectric actuators 100 included in one piezoelectric module 200X are not particularly limited. For example, the number of the piezoelectric modules 200X may be one or may be three or more. The number of the piezoelectric actuators 100 included in one piezoelectric module 200X may be one or may be three or more.

As shown in FIG. 5, in the Y driving section 8, each of the three piezoelectric modules 200Y includes stacked four piezoelectric actuators 100. That is, the Y driving section 8 includes twelve piezoelectric actuators 100 in total. Note that the twelve piezoelectric actuators 100 are respectively controlled to be driven in the same manner. That is, the voltage shown in FIG. 11 or FIG. 13 is simultaneously applied to the twelve piezoelectric actuators 100.

As shown in FIG. 6, the three piezoelectric modules 200Y are disposed side by side in the Y-axis direction and fixed (screwed) to the base 41 in the fixing sections 162. In a state in which the piezoelectric modules 200Y are fixed to the base 41, the piezoelectric modules 200Y are urged toward the driven member 81 using the elasticity of the spring sections 163. The distal end portions of the transmitting sections 140 are pressed against the upper surface of the driven member 81. Therefore, when the piezoelectric modules 200Y are stopped, a sufficient frictional force acts between the transmitting sections 140 and the driven member 81. The stage 42 is held on the base 41. The movement of the stage 42 relative to the base 41 is restricted. On the other hand, the stage 42 can be moved in the Y-axis direction relative to the base 41 by driving the piezoelectric modules 200Y to cause the transmitting sections 140 to perform an elliptical motion.

As explained above concerning the X driving section 7, a holding force Fys for holding the stage 42 on the base 41 and a driving force Fyd for moving the stage 42 in the Y-axis direction relative to the base 41 are respectively proportional to the number of the piezoelectric actuators 100 included in the Y driving section 8. As explained above, the stage 42 is present below the stage 32. Therefore, weight applied to the stage 42 is smaller than weight applied to the stage 32. Therefore, from the viewpoint of the weight, a necessary and sufficient holding force Fys and a necessary and sufficient driving force Fyd are smaller than the holding force Fxs and the driving force Fxd. The number of the piezoelectric actuators 100 disposed in the Y driving section 8 may be smaller than the number of the piezoelectric actuators 100 disposed in the X driving section 7.

However, as explained above, the electronic-component holding device 1 is supported by the Y stage 2210. Therefore, when the Y stage 2210 moves in the Y-axis direction, acceleration (inertia) in the Y-axis direction same as the moving direction of the stage 42 is applied to the stage 42. Therefore, the holding force Fys needs to be designed larger than a necessary and sufficient value calculated from the viewpoint of the weight to prevent the stage 42 from moving in the Y-axis direction relative to the base 41 with the acceleration. Accordingly, in this embodiment, the twelve piezoelectric actuators 100 are disposed in the Y driving section 8 to secure the holding force Fys and the driving force Fyd having necessary and sufficient magnitudes that can withstand the movement of the Y stage 2210 in the Y-axis direction.

As explained above, in this embodiment, the Y driving section 8 includes the three piezoelectric modules 200Y in each of which the four piezoelectric actuators 100 are stacked. However, for example, with a configuration including one piezoelectric module 200Y in which twelve piezoelectric actuators 100 are stacked, a configuration including two piezoelectric modules 200Y in each of which six piezoelectric actuators 100 are stacked, a configuration including six piezoelectric modules 200Y in each of which two piezoelectric actuators 100 are stacked, or a configuration including twelve piezoelectric modules 200Y each including one piezoelectric actuator 100, the holding force Fys and the driving force Fyd having substantially the same magnitudes can be exerted because the number of the piezoelectric actuators 100 is the same.

Note that the number of the piezoelectric modules 200Y and the number of the piezoelectric actuators 100 included in one piezoelectric module 200Y are not particularly limited. For example, the number of the piezoelectric modules 200Y may be one or two or may be four or more. The number of the piezoelectric actuators 100 included in one piezoelectric module 200Y may be one, two, or three or may be five or more.

As shown in FIG. 8, in the θ driving section 9, each of the two piezoelectric modules 200θ includes stacked two piezoelectric actuators 100. That is, the θ driving section 9 includes four piezoelectric actuators 100 in total. Note that the four piezoelectric actuators 100 are respectively controlled to be driven in the same manner. That is, the voltage shown in FIG. 11 or FIG. 13 is simultaneously applied to the four piezoelectric actuators 100.

The two piezoelectric modules 200θ are disposed side by side around the center axis O of the bearing 53 and fixed (screwed) to the base 51 in the fixing sections 162. As shown in FIG. 9, in a state in which the piezoelectric modules 200θ are fixed to the base 51, the piezoelectric modules 200θ are urged toward the driven member 91 using the elasticity of the spring sections 163. The distal end portions of the transmitting sections 140 are pressed against the upper surface of the driven member 91. Therefore, when the piezoelectric modules 200θ are stopped, a sufficient frictional force acts between the transmitting sections 140 and the driven member 91, the stage 52 is held on the base 51, and the movement of the stage 52 relative to the base 51 is restricted. On the other hand, the stage 52 can be moved in the θ direction relative to the base 51 by driving the piezoelectric modules 200θ to cause the transmitting sections 140 to perform an elliptical motion.

As explained above concerning the X driving section 7, a holding force Fθs for holding the stage 52 on the base 51 and a driving force Fθd for moving the stage 52 in the θ direction relative to the base 51 are respectively proportional to the number of the piezoelectric actuators 100 included in the θ driving section 9. As explained above, the stage 52 is present below the stage 32. Therefore, weight applied to the stage 52 is smaller than weight applied to the stage 32. Therefore, from the viewpoint of the weight, a necessary and sufficient holding force Fθs and a necessary and sufficient driving force Fθd are smaller than the holding force Fxs and the driving force Fxd. The number of the piezoelectric actuators 100 disposed in the θ driving section 9 may be smaller than the number of the piezoelectric actuators 100 disposed in the X driving section 7.

However, as explained above, the stage 52 rotates around the center axis O of the bearing 53 relative to the base 51. Therefore, transmission efficiency of a driving force of the piezoelectric actuator 100 is low compared with the stages 32 and 42 that linearly move. Therefore, to compensate for the low transmission efficiency, the driving force Fθd needs to be designed larger than a necessary and sufficient value calculated from the viewpoint of the weight. Accordingly, in this embodiment, the four piezoelectric actuators 100 are disposed in the θ driving section 9 to secure the holding force Fθs and the driving force Fθd having necessary and sufficient magnitudes.

As explained above, in this embodiment, the θ driving section 9 includes the two piezoelectric modules 200θ in each of which the two piezoelectric actuators 100 are stacked. However, for example, with a configuration including one piezoelectric module 200θ in which four piezoelectric actuators 100 are stacked or a configuration including four piezoelectric modules 200θ each including one piezoelectric actuator 100, the holding force Fθs and the driving force Fθd having substantially the same magnitudes can be exerted because the number of the piezoelectric actuators 100 is the same.

Note that the number of the piezoelectric modules 200θ and the number of the piezoelectric actuators 100 included in one piezoelectric module 200θ are not particularly limited. For example, the number of the piezoelectric modules 200θ may be one or may be three or more. The number of the piezoelectric actuators 100 included in one piezoelectric module 200θ may be one or may be three or more.

As explained above, in the X driving section 7, the Y driving section 8, and the θ driving section 9, the necessary and sufficient holding forces Fxs, Fys, and Fθs and the necessary and sufficient driving forces Fxd, Fyd, and Fθd can be exerted by using the piezoelectric actuators 100 having the same configuration and appropriately setting the numbers of the piezoelectric actuators 100 in the respective driving sections 7, 8, and 9. With such a configuration, the holding forces Fxs, Fys, and Fθs and the driving forces Fxd, Fyd, and Fθd do not become excessive or insufficient. The electronic-component holding device 1 can achieve both of stable driving and power saving.

The electronic-component holding device 1 functioning as the piezoelectric driving device is explained above. The electronic-component holding device 1 includes, as explained above, the supporting section 2, the stage 32 (the first moving section) supported by the supporting section 2 and movable in the X-axis direction (the first direction) relative to the supporting section 2, the stage (the second moving section) supported by the stage 32 and movable in the Y-axis direction (the second direction) crossing the X-axis direction relative to the stage 32, the X driving section 7 (the first driving section) including the piezoelectric actuator 100 (the first piezoelectric actuator) and configured to drive the piezoelectric actuator 100 to move the stage 32 in the X-axis direction relative to the supporting section 2 and stop the piezoelectric actuator 100 to hold the stage 32 on the supporting section 2, and the Y driving section 8 (the second driving section) including the piezoelectric actuator 100 (the second piezoelectric actuator) and configured to drive the piezoelectric actuator 100 to move the stage 42 in the Y-axis direction relative to the stage 32 and stop the piezoelectric actuator 100 to hold the stage 42 on the stage 32. The holding force Fxs (the first holding force) for holding the stage 32 on the supporting section 2 and the holding force Fys (the second holding force) for holding the stage 42 on the stage 32 are different from each other. With such a configuration, the holding forces Fxs and Fys can be properly set independently from each other without collectively setting the holding forces Fxs and Fys to the same value. Therefore, one of the holding forces Fxs and Fys is prevented from becoming excessive or insufficient. Therefore, the electronic-component holding device 1 can achieve both of stable driving and power saving.

Note that a magnitude relation between the holding forces Fxs and Fys is not particularly limited. The magnitude relation may be Fxs>Fys or may be Fxs<Fys.

As explained above, in the electronic-component holding device 1, the driving force Fxd (the first driving force) for moving the stage 32 relative to the supporting section 2 and the driving force Fyd (the second driving force) for moving the stage 42 relative to the stage 32 are different from each other. With such a configuration, the driving forces Fxd and Fyd can be properly set independently from each other without collectively setting the driving forces Fxd and Fyd to the same value. Therefore, one of the driving forces Fxd and Fyd is prevented from becoming excessive or insufficient. Therefore, the electronic-component holding device 1 can achieve both of stable driving and power saving.

Note that a magnitude relation between the driving forces Fxd and Fyd is not particularly limited. The magnitude relation may be Fxd>Fyd or may be Fxd<Fyd.

As explained above, the piezoelectric actuators 100 included in the X driving section 7 and the piezoelectric actuators 100 included in the Y driving section 8 the same configuration. The number of the piezoelectric actuators 100 included in the X driving section 7 and the number of the piezoelectric actuators 100 included in the Y driving section 8 are different from each other. In this way, the holding forces Fxs and Fys and the driving forces Fxd and Fyd can be easily appropriately set by simply setting the number of the piezoelectric actuators 100 as appropriate because the piezoelectric actuators 100 having the same configuration are used. Note that "the piezoelectric actuators 100 having the same configuration" means "the piezoelectric actuators 100 that can exert substantially the same driving force and substantially the same holding force (including an unavoidable error in manufacturing) if the conditions are the same". If such conditions are satisfied, for example, the configurations, the shapes, and the like of the piezoelectric actuators 100 included in the X driving section 7 and the Y driving section 8 may be different from each other. However, as in this embodiment, it is desirable that the piezoelectric actuators 100 included in the X driving section 7 and the Y driving section 8 have the same configuration. Consequently, the piezoelectric actuators 100 of one type only have to be prepared. Therefore, a reduction in manufacturing cost can be achieved.

As explained above, the X driving section 7 includes the piezoelectric module 200X in which the plurality of piezoelectric actuators 100 are stacked. The Y driving section 8 includes the piezoelectric module 200Y in which the plurality of piezoelectric actuators 100 are stacked. Consequently, compared with when the plurality of piezoelectric actuators 100 are separately disposed, space saving for the X driving section 7 and the Y driving section 8 can be achieved. Therefore, a reduction in the size and a reduction in the weight of the electronic-component holding device 1 can be achieved.

As explained above, the supporting section 2 is movable in the Y-axis direction. The holding force Fys is set larger than the holding force Fxs. Consequently, the holding force Fys having necessary and sufficient magnitude that can withstand acceleration caused by the movement of the supporting section 2 in the Y-axis direction can be secured.

As explained above, the electronic-component holding device 1 includes the stage 52 (the third moving section) supported by the stage 42 and turnable around the axis extending along the Z-axis direction (the third direction) crossing the X-axis direction and the Y-axis direction relative to the stage 42 and the θ driving section (the third driving section) including the piezoelectric actuator 100 (the third piezoelectric actuator) and configured to drive the piezoelectric actuator 100 to turn the stage 52 relative to the stage 42 and stop the piezoelectric actuator 100 to hold the stage 52 on the stage 42. In this way, the stage 52 is added in addition to the stages 32 and 42. Consequently, the electronic-component holding device 1 includes three movable axes. Convenience of the electronic-component holding device 1 is further improved. In particular, the electronic-component holding device 1 has a configuration suitable for the electronic-component conveying apparatus 200θ in this embodiment.

As explained above, the electronic-component conveying apparatus 200θ includes the electronic-component holding device 1 explained above. Consequently, the electronic-component conveying apparatus 200θ can enjoy the effects of the electronic-component holding device 1 and can achieve both of stable driving and power saving.

Note that, as explained above, in this embodiment, the X moving section 3 is located on the vertical-direction lower side of the supporting section 2, the Y moving section 4 is located on the vertical-direction lower side of the X moving section 3, and the θ moving section 5 is located on the vertical-direction lower side of the Y moving section 4. However, the disposition of the supporting section 2, the X moving section 3, the Y moving section 4, and the θ moving section 5 is not particularly limited. For example, the X moving section 3 may be located on the vertical direction upper side of the supporting section 2, the Y moving section 4 may be located on the vertical direction upper side of the X moving section 3, and the θ moving section 5 may be located on the vertical direction upper side of the Y moving section 4. The supporting section 2, the X moving section 3, the Y moving section 4, and the θ moving section 5 may be disposed side by side in the horizontal direction. In this embodiment, the X moving section 3, the Y moving section 4, and the θ moving section 5 are disposed in this order from the vertical direction upper side. However, the disposition of the X moving section 3, the Y moving section 4, and the θ moving section 5 is not limited to this. For example, the X moving section 3, the Y moving section 4, and the θ moving section 5 may be disposed in the order of the X moving section 3, the θ moving section 5, the Y moving section 4 from the vertical direction upper side or may be disposed in the order of the θ moving section 5, the X moving section 3, and the Y moving section 4 from the vertical direction upper side.

Second Embodiment

A robot according to a second embodiment of the invention is explained.

Figure 16:
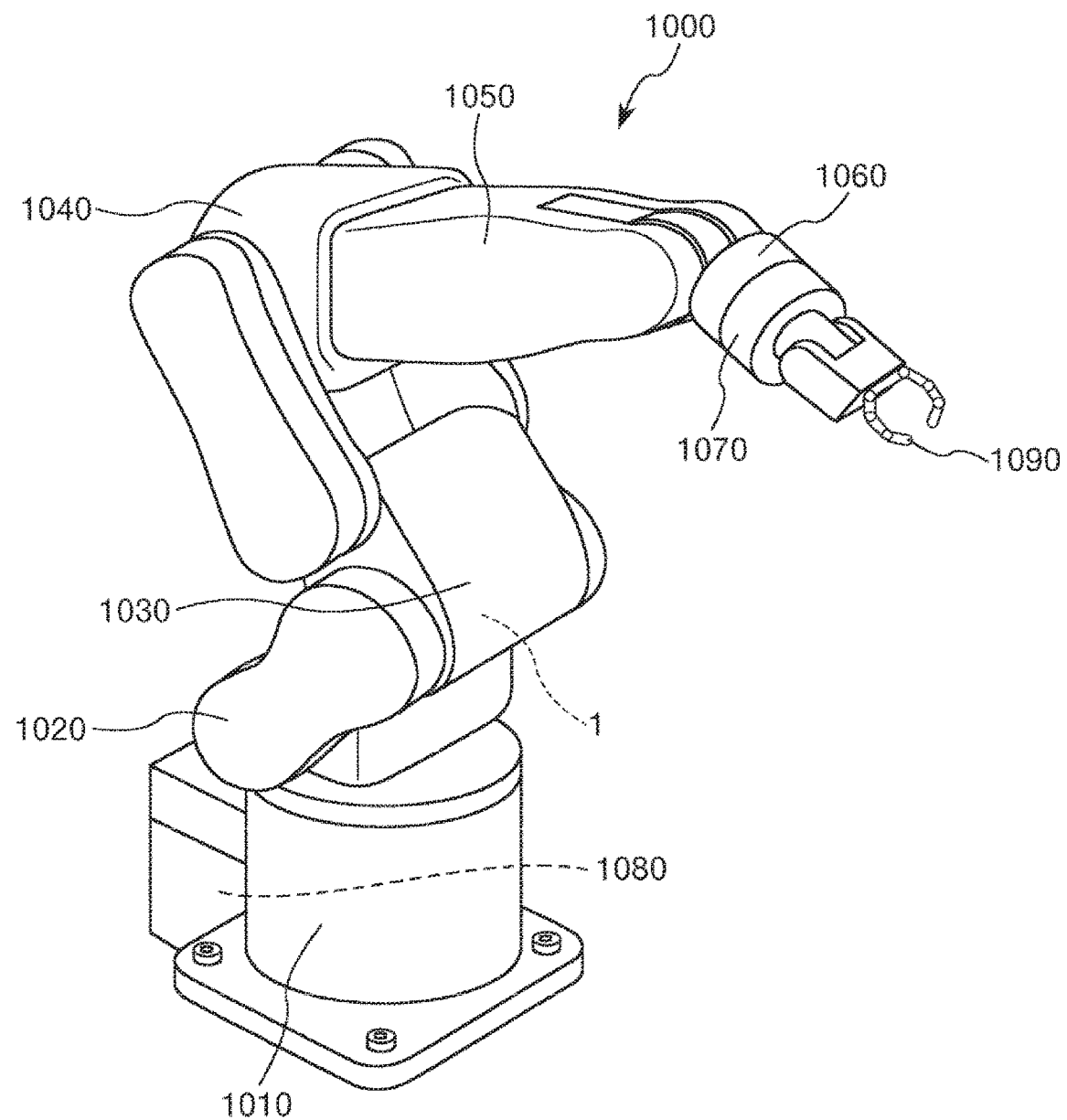
FIG. 16 is a perspective view showing a robot according to a second embodiment of the invention.

FIG. 16 is a perspective view showing the robot according to the second embodiment of the invention. FIGS. 17 to 22 are respectively sectional views showing a driving section included in the robot shown in FIG. 16.

A robot 1000 shown in FIG. 16 can perform work such as supply, removal, conveyance, and assembly of a precision instrument and components configuring the precision instrument. The robot 1000 is a six-axis robot and includes a base 1010 (a first member) fixed to a floor or a ceiling, an arm 1020 (a second member) turnably coupled to the base 1010, an arm 1030 (a third member) turnably coupled to the arm 1020, an arm 1040 turnably coupled to the arm 1030, an arm 1050 turnably coupled to the arm 1040, an arm 1060 turnably coupled to the arm 1050, an arm 1070 turnably coupled to the arm 1060, and a control device 1080 configured to control driving of the arms 1020, 1030, 1040, 1050, 1060, and 1070.

A hand connecting section is provided in the arm 1070. An end effector 1090 corresponding to work to be executed by the robot 1000 is attached to the hand connecting section.

A driving section 1310 for turning the arm 1020 relative to the base 1010 is provided in a joint portion that connects the base 1010 and the arm 1020. A driving section 1320 for turning the arm 1030 relative to the arm 1020 is provided in a joint portion that connects the arm 1020 and the arm 1030. A driving section 1330 for turning the arm 1040 relative to the arm 1030 is provided in a joint portion that connects the arm 1030 and the arm 1040. A driving section 1340 for turning the arm 1050 relative to the arm 1040 is provided in a joint portion that connects the arm 1040 and the arm 1050. A driving section 1350 for turning the arm 1060 relative to the arm 1050 is provided in a joint portion that connects the arm 1050 and the arm 1060. A driving section 1360 for turning the arm 1070 relative to the arm 1060 is provided in a joint portion that connects the arm 1060 and the arm 1070.

A load applied to an arm further on the proximal end side is larger. Therefore, a driving force Fd1 necessary and sufficient for turning the arm 1020 relative to the base 1010 and a holding force Fs1 necessary and sufficient for holding the arm 1020 on the base 1010 are larger than a driving force Fd2 necessary and sufficient for turning the arm 1030 relative to the arm 1020 and a holding force Fs2 necessary and sufficient for holding the arm 1030 on the arm 1020. The driving force Fd2 and the holding force Fs2 are larger than a driving force Fd3 necessary and sufficient for turning the arm 1040 relative to the arm 1030 and a holding force Fs3 necessary and sufficient for holding the arm 1040 on the arm 1030. The driving force Fd3 and the holding force Fs3 are larger than a driving force Fd4 necessary and sufficient for turning the arm 1050 relative to the arm 1040 and a holding force Fs4 necessary and sufficient for holding the arm 1050 on the arm 1040. The driving force Fd4 and the holding force Fs4 are larger than a driving force Fd5 necessary and sufficient for turning the arm 1060 relative to the arm 1050 and a holding force Fs5 necessary and sufficient for holding the arm 1060 on the arm 1050. The driving force Fd5 and the holding force Fs5 are larger than a driving force Fd6 necessary and sufficient for turning the arm 1070 relative to the arm 1060 and a holding force Fs6 necessary and sufficient for holding the arm 1070 on the arm 1060. That is, a relation among the driving forces is Fd1>Fd2>Fd3>Fd4>Fd5>Fd6 and a relation among the holding forces is Fs1>Fs2>Fs3>Fs4>Fs5>Fs6.

Figure 17:
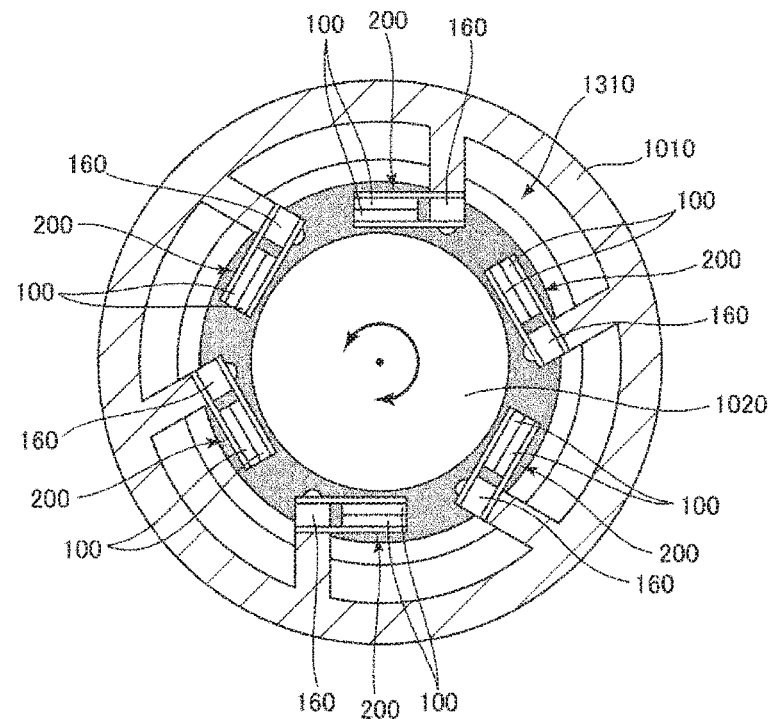
FIG. 17 is a sectional view showing a driving section included in the robot shown in FIG. 16.
Figure 18:
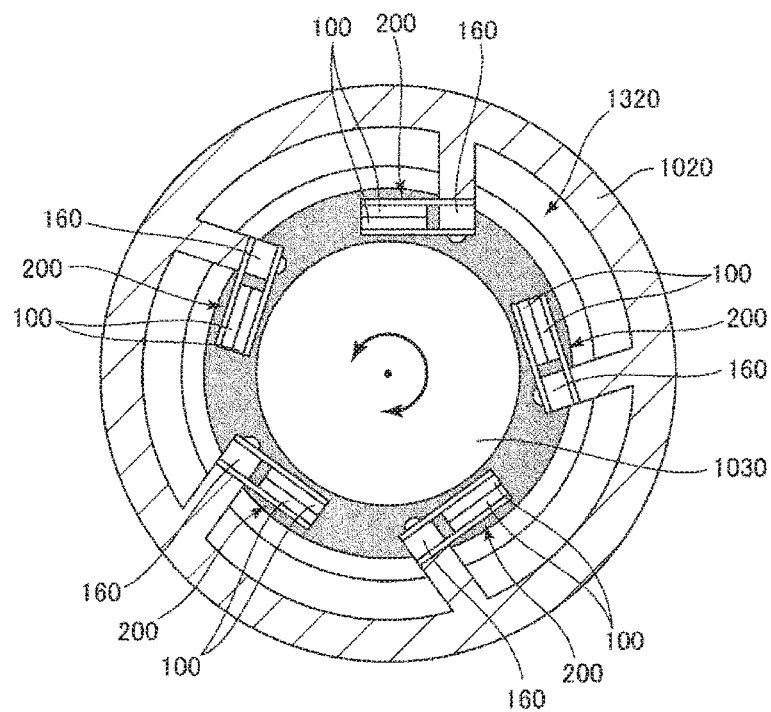
FIG. 18 is a sectional view showing the driving section included in the robot shown in FIG. 16.
Figure 19:
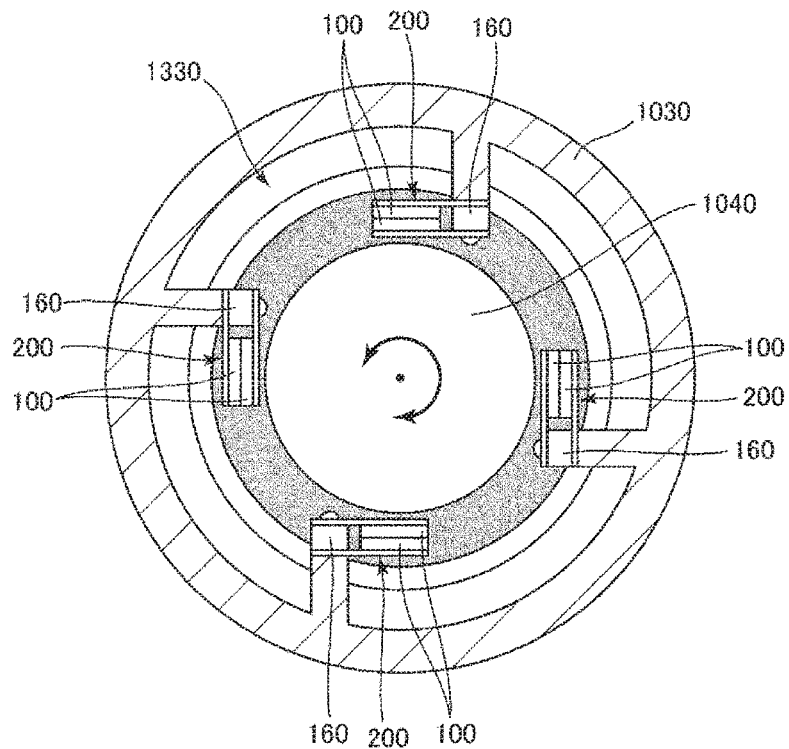
FIG. 19 is a sectional view showing the driving section included in the robot shown in FIG. 16.
Figure 20:
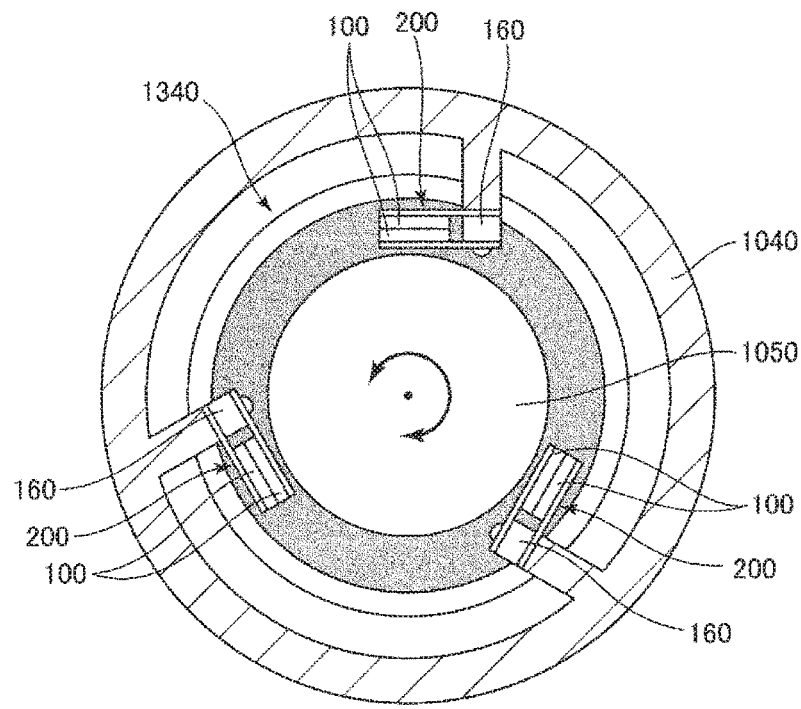
FIG. 20 is a sectional view showing the driving section included in the robot shown in FIG. 16.
Figure 21:
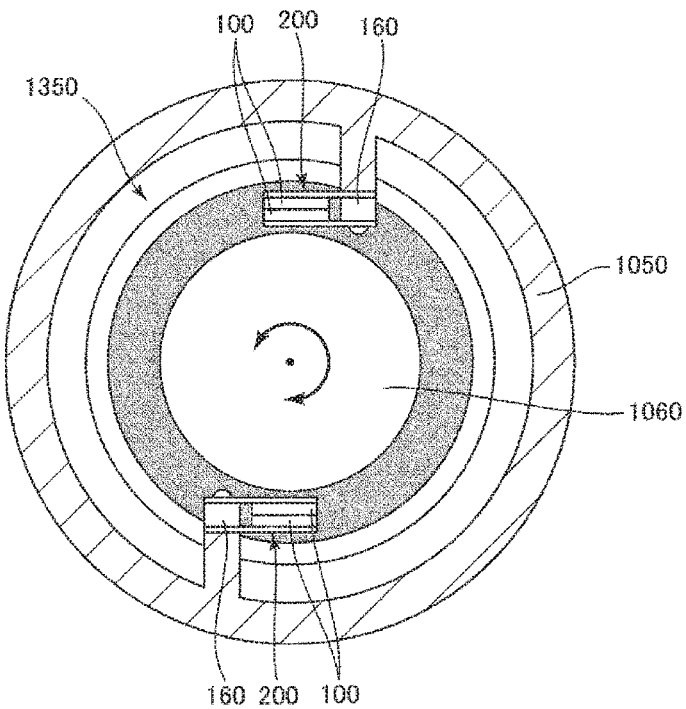
FIG. 21 is a sectional view showing the driving section included in the robot shown in FIG. 16.
Figure 22:
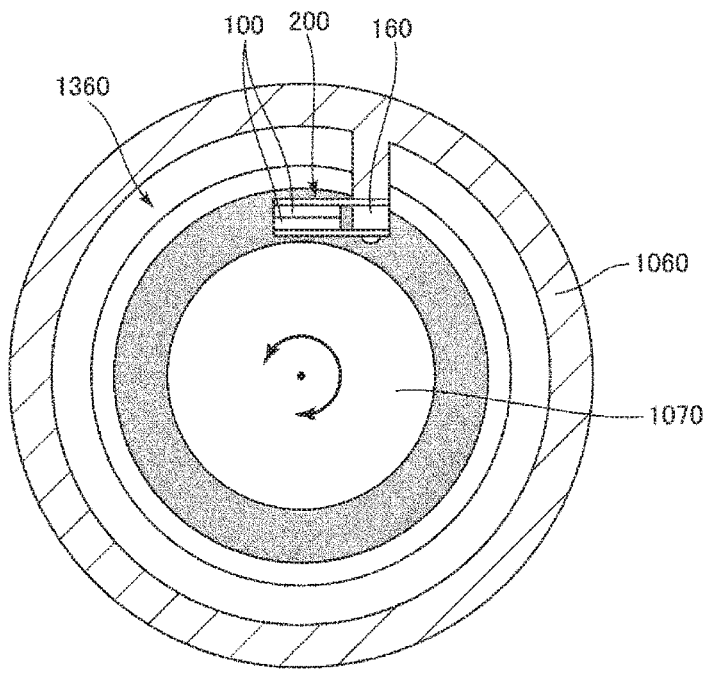
FIG. 22 is a sectional view showing the driving section included in the robot shown in FIG. 16.

Therefore, as shown in FIG. 17, the driving section 1310 includes six piezoelectric modules 200 in each of which two piezoelectric actuators 100 are stacked (i.e., twelve piezoelectric actuators 100 in total) to secure the necessary and sufficient driving force Fd1 and the necessary and sufficient holding force Fs1. As shown in FIG. 18, the driving section 1320 includes five piezoelectric modules 200 (i.e., ten piezoelectric actuators 100 in total) to secure the necessary and sufficient driving force Fd2 and the necessary and sufficient holding force Fs2. As shown in FIG. 19, the driving section 1330 includes four piezoelectric modules 200 (i.e., eight piezoelectric actuators 100 in total) to secure the necessary and sufficient driving force Fd3 and the necessary and sufficient holding force Fs3. As shown in FIG. 20, the driving section 1340 includes three piezoelectric modules 200 (i.e., six piezoelectric actuators 100 in total) to secure the necessary and sufficient driving force Fd4 and the necessary and sufficient holding force Fs4. As shown in FIG. 21, the driving section 1350 includes two piezoelectric modules 200 (i.e., four piezoelectric actuators 100 in total) to secure the necessary and sufficient driving force Fd5 and the necessary and sufficient holding force Fs5. As shown in FIG. 22, the driving section 1360 includes one piezoelectric module 200 (i.e., two piezoelectric actuators 100 in total) to secure the necessary and sufficient driving force Fd6 and the necessary and sufficient holding force Fs6. Note that the piezoelectric actuators 100 used in the driving sections 1310, 1320, 1330, 1340, 1350, and 1360 have the same configuration as in the first embodiment explained above. The piezoelectric module 200 includes the urging section 160 as in the first embodiment.

As explained above, in the driving sections 1310, 1320, 1330, 1340, 1350 and 1360, the piezoelectric actuators 100 having the same configuration are used. The numbers of the piezoelectric actuators 100 are appropriately set in the respective driving sections 1310, 1320, 1330, 1340, 1350, and 1360. Consequently, the driving sections 1310, 1320, 1330, 1340, 1350, and 1360 can respectively exert the necessary and sufficient holding forces Fs1, Fs2, Fs3, Fs4, Fs5, and Fs6 and the necessary and sufficient driving forces Fd1, Fd2, Fd3, Fd4, Fd5, and Fd6. Therefore, the holding forces Fs1, Fs2, Fs3, Fs4, Fs5, and Fs6 and the driving forces Fd1, Fd2, Fd3, Fd4, Fd5, and Fd6 do not become excessive or insufficient. The robot 1000 can achieve both of stable driving and power saving.

Note that the numbers of the piezoelectric modules 200 included in the driving sections 1310, 1320, 1330, 1340, 1350, and 1360 and the number of the piezoelectric actuators 100 included in one piezoelectric module 200 are not particularly limited and can be set as appropriate according to the configuration of the robot 1000 (e.g., loads applied to the arm).

The robot 1000 is explained above. The robot 1000 includes, as explained above, the base 1010 (the first member), the arm 1020 (the second member) supported by the base 1010 and displaceable relative to the base 1010, the arm 1030 (the third member) supported by the arm 1020 and displaceable relative to the arm 1020, the driving section 1310 (the first driving section) including the piezoelectric actuator 100 (the first piezoelectric actuator) and configured to drive the piezoelectric actuator 100 to displace the arm 1020 relative to the base 1010 and stop the piezoelectric actuator 100 to hold the arm 1020 on the base 1010, and the driving section 1320 (the second driving section) including the piezoelectric actuator 100 (the second piezoelectric actuator) and configured to drive the piezoelectric actuator 100 to displace the arm 1030 relative to the arm 1020 and stop the piezoelectric actuator 100 to hold the arm 1030 on the arm 1020. The holding force Fs1 (the first holding force) for holding the arm 1020 on the base 1010 and the holding force Fs2 (the second holding force) for holding the arm 1030 on the arm 1020 are different from each other. With such a configuration, the holding forces Fs1 and Fs2 can be properly set independently from each other. Therefore, one of the holding forces Fs1 and Fs2 is prevented from becoming excessive or insufficient. Therefore, the robot 1000 can achieve both of stable driving and power saving.

As explained above, in the robot 1000, the driving force Fd1 (the first driving force) for moving the arm 1020 relative to the base 1010 and the driving force Fd2 (the second driving force) for moving the arm 1030 relative to the arm 1020 are different from each other. With such a configuration, the driving forces Fd1 and Fd2 can be properly set independently from each other. Therefore, one of the driving forces Fd1 and Fd2 is prevented from becoming excessive or insufficient. Therefore, the robot 1000 can achieve both of stable driving and power saving.

As explained above, the piezoelectric actuators 100 included in the driving section 1310 and the piezoelectric actuators 100 included in the driving section 1320 have the same configuration. The number of the piezoelectric actuators 100 included in the driving section 1310 and the number of the piezoelectric actuators 100 included in the driving section 1320 are different from each other. In this way, the piezoelectric actuators 100 having the same configuration are used. Consequently, the holding forces Fs1 and Fs2 and the driving forces Fd1 and Fd2 can be easily appropriately set simply by setting the number of the piezoelectric actuators 100 as appropriate.

Note that, in this embodiment, for convenience of explanation, the base 1010 is set as the first member, the arm 1020 is set as the second member, and the arm 1030 is set as the third member. However, any ones of the base 1010 and the arms 1020, 1030, 1040, 1050, 1060, and 1070 may be set as the first member, the second member, and the third member. The configuration of the robot 1000 is not limited to the configuration in this embodiment and may be, for example, a horizontal articulated robot (a SCARA robot).

The embodiments of the invention are explained above with reference to the drawings. However, the invention is not limited to the embodiments. The components of the sections can be replaced with any components having the same functions. Any other components may be added to the invention.

In the embodiments, the X axis, the Y axis, and the Z axis are orthogonal to one another. However, the X axis, the Y axis, and the Z axis only have to cross and do not have to be orthogonal to one another.

The entire disclosure of Japanese Patent Application No. 2017-219425, filed Nov. 14, 2017 is expressly incorporated by reference herein.

What is claimed is:

1. A piezoelectric driving device comprising:
a supporting section;
a first moving section supported by the supporting section and movable in a first direction relative to the supporting section;
a second moving section supported by the first moving section and movable in a second direction crossing the first direction relative to the first moving section;
a first driving section including a first piezoelectric actuator and configured to drive the first piezoelectric actuator to move the first moving section in the first direction relative to the supporting section and stop the first piezoelectric actuator to hold the first moving section on the supporting section;
a second driving section including a second piezoelectric actuator and configured to drive the second piezoelectric actuator to move the second moving section in the second direction relative to the first moving section and stop the second piezoelectric actuator to hold the second moving section on the first moving section;
a third moving section supported by the second moving section and turnable around an axis extending along a third direction crossing the first direction and the second direction relative to the second moving section; and
a third driving section including a third piezoelectric actuator and configured to drive the third piezoelectric actuator to turn the third moving section relative to the second moving section and stop the third piezoelectric actuator to hold the third moving section on the second moving section, wherein
a first holding force for holding the first moving section on the supporting section and a second holding force for holding the second moving section on the first moving section are different from each other.

2. The piezoelectric driving device according to claim 1, wherein a first driving force for moving the first moving section relative to the supporting section and a second driving force for moving the second moving section relative to the first moving section are different.

3. The piezoelectric driving device according to claim 1, wherein
the first piezoelectric actuator and the second piezoelectric actuator have a same configuration, and
a number of the first piezoelectric actuators included in the first driving section and a number of the second piezoelectric actuators included in the second driving section are different.

4. The piezoelectric driving device according to claim 1, wherein
the first driving section includes a piezoelectric module in which a plurality of the first piezoelectric actuators are stacked, and
the second driving section includes a piezoelectric module in which a plurality of the second piezoelectric actuators are stacked.

5. The piezoelectric driving device according to claim 1, wherein
the supporting section is movable in the second direction, and
the second holding force is larger than the first holding force.

6. An electronic-component conveying apparatus comprising the piezoelectric driving device according to claim 1.

7. An electronic-component conveying apparatus comprising the piezoelectric driving device according to claim 2.

8. An electronic-component conveying apparatus comprising the piezoelectric driving device according to claim 3.

9. An electronic-component conveying apparatus comprising the piezoelectric driving device according to claim 4.

10. An electronic-component conveying apparatus comprising the piezoelectric driving device according to claim 5.

11. A robot comprising:
a first member;
a second member supported by the first member and displaceable relative to the first member;
a third member supported by the second member and displaceable relative to the second member;

a fourth member supported by the third member and displaceable relative to the third member;

a first driving section including a first piezoelectric actuator and configured to drive the first piezoelectric actuator to displace the second member relative to the first member and stop the first piezoelectric actuator to hold the second member on the first member;

a second driving section including a second piezoelectric actuator and configured to drive the second piezoelectric actuator to displace the third member relative to the second member and stop the second piezoelectric actuator to hold the third member on the second member; and a third driving section including a third piezoelectric actuator and configured to drive the third piezoelectric actuator to displace the fourth member relative to the third member and stop the third piezoelectric actuator to hold the fourth member on the third member, wherein a first holding force for holding the second member on the first member and a second holding force for holding the third member on the second member are different.

12. The robot according to claim 11, wherein a first driving force for moving the second member relative to the first member and a second driving force for moving the third member relative to the second member are different.

13. The robot according to claim 11, wherein
the first piezoelectric actuator and the second piezoelectric actuator have a same configuration, and
a number of the first piezoelectric actuators included in the first driving section and a number of the second piezoelectric actuators included in the second driving section are different.

* * * * *